(12) United States Patent
Lin

(10) Patent No.: US 8,704,697 B2
(45) Date of Patent: Apr. 22, 2014

(54) INTEGRATION AND ANALOG TO DIGITAL CONVERSION CIRCUIT WITH COMMON CAPACITORS AND OPERATING METHOD THEREOF

(71) Applicant: Egalax_Empia Technology Inc., Taipei (TW)

(72) Inventor: Po-Chuan Lin, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 0 days.

(21) Appl. No.: 13/689,931

(22) Filed: Nov. 30, 2012

(65) Prior Publication Data
US 2013/0135134 A1    May 30, 2013

Related U.S. Application Data

(60) Provisional application No. 61/564,995, filed on Nov. 30, 2011.

(51) Int. Cl.
*H03M 1/12* (2006.01)
*H03M 1/46* (2006.01)

(52) U.S. Cl.
CPC ............... *H03M 1/466* (2013.01); *H03M 1/12* (2013.01)
USPC ........................................ 341/172; 341/155

(58) Field of Classification Search
CPC ......... H03M 1/466; H03M 1/12; H03M 1/38; H03M 1/40; H03M 1/403
USPC ................................................. 341/155, 172
See application file for complete search history.

(56) References Cited

U.S. PATENT DOCUMENTS

| | | | | |
|---|---|---|---|---|
| 5,099,239 A | * | 3/1992 | Bruce et al. | 341/155 |
| 6,087,970 A | * | 7/2000 | Panicacci | 341/172 |
| 6,243,034 B1 | * | 6/2001 | Regier | 341/166 |
| 7,511,648 B2 | * | 3/2009 | Trifonov et al. | 341/143 |

* cited by examiner

*Primary Examiner* — Khai M Nguyen
(74) *Attorney, Agent, or Firm* — WPAT, PC; Justin King

(57) ABSTRACT

The present invention provides an integration and analog to digital conversion circuit sharing common capacitors. The circuit comprises a first capacitor array module, a second capacitor module, an integration circuit, an analog to digital conversion (ADC) logic. The first capacitor array module has a plurality of capacitors. The second capacitor array module has a plurality of capacitors. The integration circuit is configured to integrate an analog signal by said first or said second capacitor array module. The ADC logic is configured to convert the output of said first or said second capacitor array module to a digital signal. The ADC logic performs conversion by said first capacitor array module while said integration circuit performs integration by said second capacitor array module, and said ADC logic performs conversion by said second capacitor array module while said integration circuit performs integration by said first capacitor array module.

23 Claims, 27 Drawing Sheets

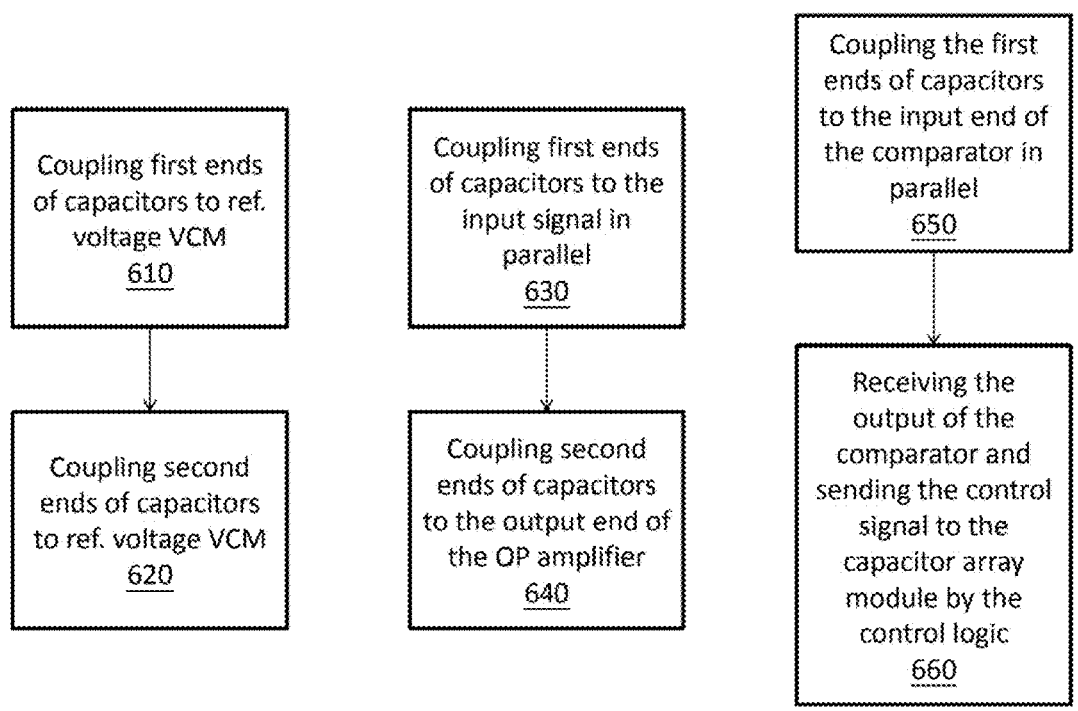

INTEGRATION AND ANALOG TO DIGITAL CONVERSION CIRCUIT WITH COMMON CAPACITORS AND OPERATING METHOD THEREOF

CROSS REFERENCE TO RELATED PATENT APPLICATION

This patent application claims the domestic priority of the U.S. provisional application 61/564,995 filed on Nov. 30, 2011, and hereby incorporated by reference.

BACKGROUND OF THE INVENTION

1. Field of the Invention

The present invention generally relates to a successive approximation register analog to digital converter (SAR-ADC), especially to a SAR-DAC including an analog integrator.

2. Description of the Prior Art

A sample and hold circuit for a traditional touch panel may be saturated due to large instantaneous noise. The instantaneous noise may come from a power supply, a conductive substance touching the panel, a human body approaching the panel or the like, causing a difference between a sensing value of a sensor in the touch panel and a value sampled and held by the S/H circuit. In other words, the S/H circuit must discard the value sampled and held this time, and then perform S/H operation on the sensing value of the sensor in the touch panel again. As such, not only the operation time for the S/H circuit is increased, and it may not be possible to measure the original sensing value of the sensor in the touch panel in the next S/H operation. (For example, assuming in the previous S/H operation the S/H circuit has obtained 40% of the sensing value of the sensor in the touch panel, but this value is discarded due to saturation caused by the instantaneous noise, then the S/H circuit may only obtain the remaining 60% of the sensing value of the sensor in the current S/H operation).

Moreover, the S/H circuits for traditional touch panels typically operate only in the positive or negative pulses, so 50% of the clock cycles are wasted. Alternatively, some S/H circuits employ inverters so that they can operate in both the positive and negative pulses (e.g. negative pulses are converted into positive pulses via the inverter, and a S/H circuit operating in the positive pulses can now operate in what originally were the negative pulses). However, transmission time delays in the inverters may result in pulse overlap in high-speed S/H circuits. For example, assuming that after a negative pulse is converted into a positive pulse via an inverter a 5% transmission time delay is introduced to the pulse, then the pulse time of the last 5% of the waveform of this positive pulse will overlap the pulse time of the first 5% of the waveform of the next positive pulse. This pulse overlap problem is more noticeable and severe particularly in high-frequency S/H circuits or inverters with large transmission time delays, which may even result in S/H circuit disorder. Alternatively, some S/H circuits employ inverters to directly perform phase conversion on the results sampled and held by the S/H circuits before using them. However, control clocks of the inverters and the transmission time delays are still problems that are yet to be solved.

In view of these shortcomings, the present invention thus provides a multi-stage S/H circuit for positive and negative pulse cycles that alleviates the saturation issue caused by the instantaneous noise in the traditional S/H circuits and addresses the pulse overlap problem in the traditional S/H circuits for positive and negative pulse cycles, while achieving S/H operations for positive and negative pulse cycles.

Among traditional ADC, SAR-ADC is one of common ADC. In the design of SAR-ADC, a binary tree structure is formed by a capacitor array. Utilizing a comparator and a control logic, the SAR-ADC can deliver an output bits which has nth order of 2. As mentioned above, ordinary S/H circuit also comprises capacitor used to integrate the input analog signal.

Since the capacitor occupies quite large die area, if capacitors can be shared by S/H circuit and the attached SAR-ADC, some die area could be spared for decreasing manufacture cost.

SUMMARY OF INVENTION

The present invention provides an integration and analog to digital conversion circuit sharing common capacitors. The circuit comprises a first capacitor array module, a second capacitor module, a integration circuit, an analog to digital conversion (ADC) logic. The first capacitor array module has a plurality of capacitors. The second capacitor array module has a plurality of capacitors. The integration circuit is configured to integrate an analog signal by said first or said second capacitor array module. The ADC logic is configured to convert the output of said first or said second capacitor array module to a digital signal. The ADC logic performs conversion by said first capacitor array module while said integration circuit performs integration by said second capacitor array module, and said ADC logic performs conversion by said second capacitor array module while said integration circuit performs integration by said first capacitor array module.

In one embodiment of the present invention, an analog to digital converter (ADC) is provided, which is configured to integrate a first input signal and a second input signal, respectively, and to convert in turn to a first n-bit digital signal and a second n-bit digital signal. The ADC comprises an input signal switch, a first and a second capacitor array modules, an OP amplifier, a comparator, and a control logic. The input signal switch is configured to receive said first and said second input signals and to send out one of said input signals from an output end. The first capacitor array module is configured to couple said output end of said input signal switch and a reference voltage VCM. The first capacitor array module comprises a plurality of first capacitors. The second capacitor array module is configured to couple said output end of said input signal switch and said reference voltage VCM. The second capacitor array module comprises a plurality of second capacitors. The OP amplifier is configured to couple said output end of said input signal switch and said reference voltage VCM. An output end of said OP amplifier is configured to couple to said first and said second capacitor array modules. First ends of said plurality of first capacitors are coupled to said output end of said input signal switch, said reference voltage VCM, or an output end of said comparator. First ends of said plurality of second capacitors are coupled to said output end of said input signal switch, said reference voltage VCM, or an output end of said comparator. The control logic is configured to receive an output signal of said comparator, to send out said n-bit digital signals and a control signal to said first and said second capacitor array module.

In another embodiment of the present invention, an operating method of the ADC is provided. The method comprises steps for discharging said first capacitor array module as follows: coupling first ends of said plurality of first capacitors to said reference voltage VCM; and coupling second ends of said plurality of first capacitors to said reference voltage VCM.

BRIEF DESCRIPTION OF THE DRAWINGS

FIG. 6A is a flow chart diagram illustrates an operating method of an analog to digital converter in accordance with an embodiment of the present invention.

FIG. 6B is a flow chart diagram illustrates an operating method of an analog to digital converter in accordance with another embodiment of the present invention.

FIG. 6C is a flow chart diagram illustrates an operating method of an analog to digital converter in accordance with another embodiment of the present invention.

DETAILED DESCRIPTION OF THE PREFERRED EMBODIMENTS

Figure 1A:
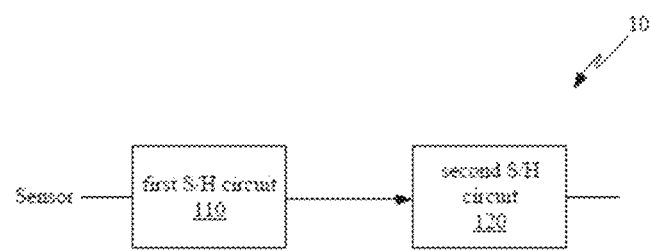
FIG. 1A is a diagram shows a multi-stage sample and hold circuit in accordance with an embodiment of the present invention.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Referring to FIG. 1A, a block diagram illustrating a preferred embodiment 10 of the present invention is shown. A first sample and hold (S/H) circuit 110 samples a sensing signal of a sensor in multiple stages and accumulates them into a first sampled signal, and outputs this first sampled signal at a first determined time. A second S/H circuit 120 receives a plurality of the first sampled signals outputted by the first S/H circuit 110 and sums them into a second sampled signal, and outputs this second sampled signal at a second determined time. In this embodiment, the first S/H circuit 110 first samples the sensing signal of the sensor in multiple short durations, and then accumulates them and stores it, and then outputs it to the second S/H circuit 120. The second S/H circuit 120 receives a plurality of outputs from the first S/H circuit 110 and sums them and stores it, and finally outputs the total sensing signal of the sampled sensor.

In the operations of the first S/H circuit 110 and the second S/H circuit 120, although the first S/H circuit 110 may be saturated due to the instantaneous noise being too large, this only affects a small portion of the multi-sampled results of the first S/H circuit 110, and the sampled results of the second S/H circuit 120 will not be significantly influenced, thus eliminating the saturation issue of the traditional S/H circuits as a result of the instantaneous noise being too large. For example, assuming the first S/H circuit 110 samples and accumulates the sensing signal in three short durations (e.g. 3 times/0.5 pulse) before outputting it to the second S/H circuit 120; and the second S/H circuit 120 receives and sums 20 outputs of the first S/H circuit 110 before outputting the total sensing signal sampled, then even if the first S/H circuit 110 is saturated one or a few times due to the instantaneous noise, it would be more difficult to saturate the second S/H circuit 120 during the sampling process, thereby increasing the tolerance to noise of the S/H circuit. Furthermore, for the total sampled sensing signal, even if one or some saturated result(s) of the first S/H circuit 110 is discarded, the effect on the total sampled sensing signal is relatively smaller than that in the prior art. For example, assuming two sampled results of the first S/H circuit 110 have become saturated due to the instantaneous noise being too large, but these two is only 1/10 of the total 20.

Figure 1B:
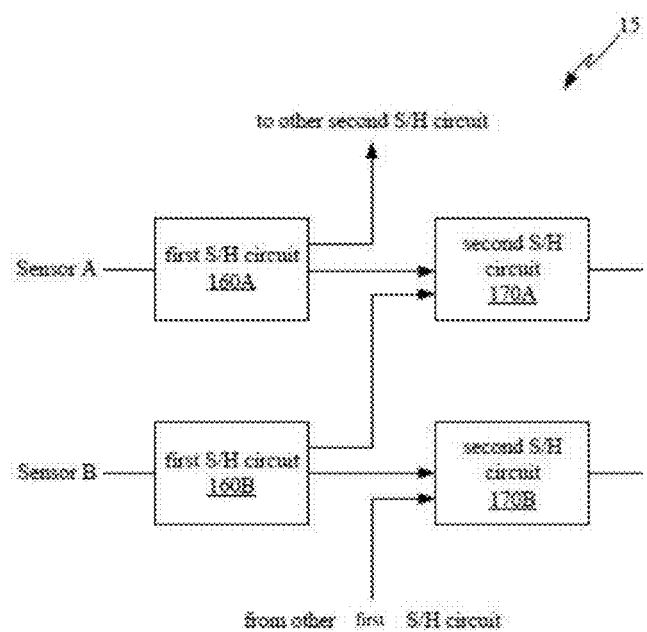
FIG. 1B is a diagram shows another multi-stage sample and hold circuit in accordance with an embodiment of the present invention.

Referring to FIG. 1B, a block diagram illustrating a preferred embodiment 15 of the present invention is shown. Functions and corresponding relationships of two first S/H circuits 160A and 160B and two second S/H circuits 170A and 170B are similar to those of the first S/H circuit 110 and the second S/H circuit 120 described in FIG. 1A. The difference is in that the two first S/H circuits 160A and 160B further provide sampled results with polarities opposite to those of the original to specific second S/H circuits. In this embodiment, for example, the first S/H circuit 160B further outputs sampled results with inverted polarities to the second S/H circuit 170A, thereby eliminating the noise in the sensing signals. The following will be described using this embodiment, and one with ordinary skill in the art can make various modifications based on the descriptions of this embodiment without departing from the scope of the present invention, and thus these modifications will not be described in the application.

Referring still to FIG. 1B, the first S/H circuits 160A and 160B each samples a respective sensing signal of two sensors A and B in multiple short durations and accumulate them into two first sampled signals, and then outputs the two positive and negative first sampled signals in a first determined time. In this embodiment, the first S/H circuits 160A and 160B each outputs the positive first sampled signal to the respective second S/H circuits 170A and 170B; meanwhile, the first S/H circuit 160A also outputs the negative first sampled signal to another second S/H circuit; the first S/H circuit 160B also outputs the negative first sampled signal to the second S/H circuit 170A; and the second S/H circuit 170B also receives the negative first sampled signal of another first S/H circuit at the same time. According to the above operations, the second S/H circuits 170A and 170B each receives the difference of the first sampled signals. Take the second S/H circuit 170A as an example, it receives both the positive first sampled signal from the first S/H circuit 160A and the negative first sampled signal from the first S/H circuit 160B, when the adjacent sensors A and B both experience similar noise, the noise in the positive and negative first sampled signals will cancel each other out, that is, this difference is a sampled sensing value with low noise. Since during the actual sensing of a typical touch panel, adjacent or nearby sensors often have the same amount of sensing noise, so a large portion of such sensing noise can be eliminated through the above processing mechanism in this embodiment. Thus, in this embodiment, the sensors A and B can be two adjacent or nearby sensors in a touch panel.

The above description illustrates the operations of the embodiment shown in FIG. 1B in positive pulse cycles, the operations in negative pulse cycles are described as follow. The first S/H circuits 160A and 160B each still samples the respective sensing signal of the two sensors A and B in multiple short durations and accumulate them into two first sampled signals, and then outputs the two positive and negative first sampled signals in a first determined time. The difference is in that, in here, the first S/H circuits 160A and 160B each outputs the negative first sampled signal to the respective second S/H circuits 170A and 170B; meanwhile, the first S/H circuit 160A also outputs the negative first sampled signal to another second S/H circuit; the first S/H circuit 160B also outputs the positive first sampled signal to the second S/H circuit 170A; and the second S/H circuit 170B also receives the positive first sampled signal of another first S/H circuit at the same time. According to these operations, the second S/H circuits 170A and 170B each also receives the difference of the first sampled signals. Again, take the second S/H circuit 170A as an example, it receives both the negative first sampled signal from the first S/H circuit 160A and the positive first sampled signal from the first S/H circuit 160B, and when the adjacent sensors A and B both experience similar noise, the noise in the positive and negative first sampled signals will cancel each other out, that is, this difference is still a sampled sensing value with low noise. Based on the processes and descriptions above, the present embodiment can operate in both the negative and positive pulse cycles, and the concept of difference is used for eliminating the noise. In an example of the present invention, the second S/H circuits provide outputs of the positive pulse cycles and outputs of the negative pulse cycles separately. In another example of the present invention, the second S/H circuits provide outputs of an accumulation of a positive and a negative pulse cycle. In yet another example of the present invention, the second S/H circuits provide outputs of an accumulation of multiple positive and negative pulse cycles.

Figure 2:
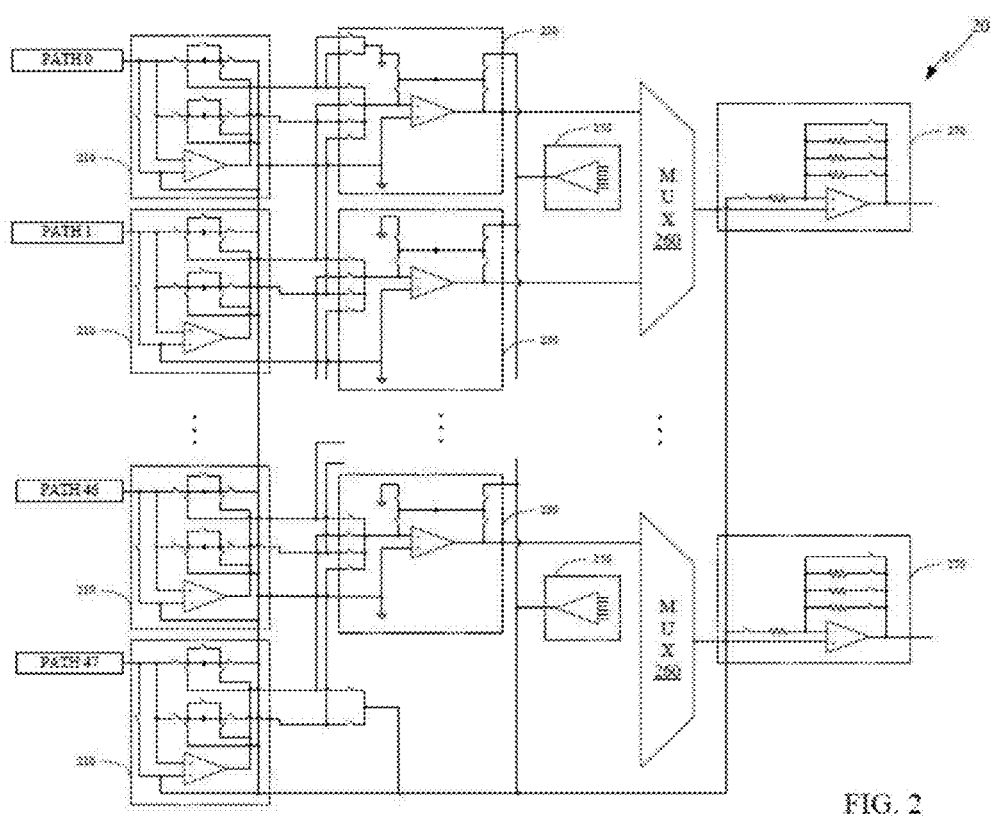
FIG. 2 is a diagram illustrates components of a sensor circuit module in accordance with an embodiment of the present invention.

Referring to FIG. 2, a circuit diagram illustrating a preferred circuit 20 combining the embodiments described with respect to FIGS. 1A and 1B of the present invention is shown. A plurality of first S/H circuits 210 sample corresponding plurality of sensing signals in multiple stages via a plurality of paths (e.g. paths 0, 1, . . . 46 and 47), and then accumulates them into a plurality of first sampled signals, and outputs the first sampled signals in a first determined time. A plurality of second S/H circuits 230 correspondingly receive the first sampled signals outputted multiple times by the first S/H circuits 210, and sum them into a plurality of second sampled signals, and output the second sampled signals at a second determined time. In this embodiment, according to the operation principle of the embodiment 10 described in FIG. 1A, even if one (or some) of the first S/H circuits 210 is (are) saturated due to the instantaneous noise being too large, this only affects a small portion of the multi-stage sampled results of this (these) first S/H circuit(s) 210, and the sampled results of its (or their) corresponding second S/H circuit(s) 230 will not be greatly influenced, thus lessening the saturation issue of the traditional S/H circuits as a result of the instantaneous noise being too large. In addition, in this embodiment, according to the operation principle of the embodiment 15 described in FIG. 1B, each first S/H circuit 210 samples the sensing signal of a corresponding sensor in multiple short durations via the corresponding path; and each second S/H circuit 230 receives both the positive first sampled signal (or the negative first sampled signal) output from its corresponding first S/H circuit 210 and the negative first sampled signal (or the positive first sampled signal) output from an adjacent first S/H circuit 210 at the same time. Thus, this embodiment not only operates in positive and negative pulse cycles, but also uses differences to eliminate the noise.

Referring still to FIG. 2, a plurality of (in this embodiment two) analog-to-digital (AD) converters 250 each receives the second sampled signals outputted by a corresponding portion of the second S/H circuits 230, and converts the received second sampled signals from analog to digital form using timing control. A plurality of (in this embodiment two) multiplexers 260 each receives the second sampled signals outputted by a corresponding portion of the second S/H circuits 230, and selects one of them. A plurality of (in this embodiment two) buffer amplifier 270 each receives a corresponding output of the multiplexers 260 and performs amplification, wherein the buffer amplifier 270 have a plurality of amplifying ratios to choose from.

Figure 3A:
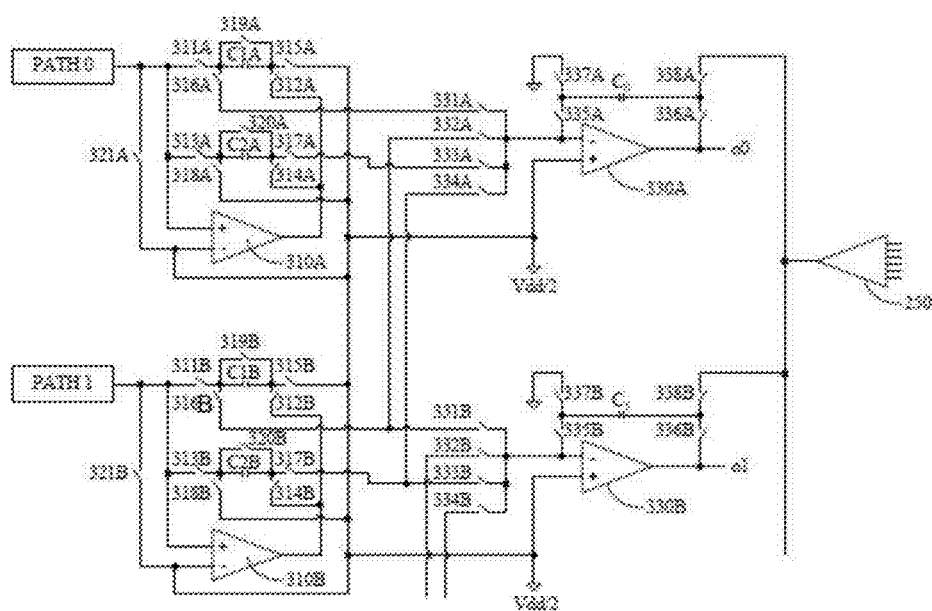
FIG. 3A is a diagram illustrates components of another sensor circuit module in accordance with an embodiment of the present invention.
Figure 3B:
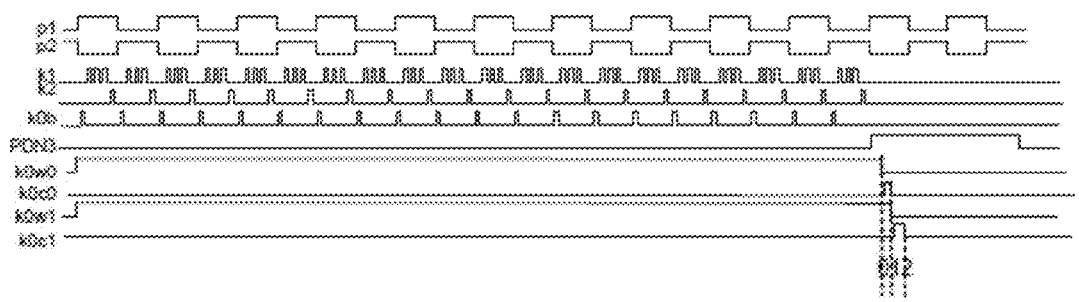
FIG. 3B is a waveform diagram of the sensor circuit module shown in the FIG. 3A.

Referring now to FIGS. 3A and 3B, a detailed circuit diagram and a timing diagram illustrating some portions of the first S/H circuits, the second S/H circuit and AD converters in the embodiment shown in FIG. 2 are shown, respectively. Each first S/H circuit includes an operational amplifier (e.g. a first operational amplifier 310A or 310B), two capacitors (e.g. a first capacitor C1A or C1B and a second capacitor C2A or C2B) and a plurality of switches (e.g. 311A, 312A, 313A, 314A, 315A, 316A, 317A, 318A, 319A, 320A and 321A or 311B, 312B, 313B, 314B, 315B, 316B, 317B, 318B, 319B, 320B and 321B), wherein the two capacitors are connected in parallel and forming a first integration circuit with the operational amplifier. The plurality of switches are connected to the charge/discharge paths of the two capacitors, thereby controlling time and polarity of charge/discharge of the two capacitors. Each second S/H circuit also includes an operational amplifier (e.g. a second operational amplifier 330A or 330B), a capacitor (e.g. a third capacitor C0 or C1) and a plurality of switches (e.g. 331A, 332A, 333A, 334A, 335A, 336A, 337A and 338A or 331B, 332B, 333B, 334B, 335B, 336B, 337B and 338B), wherein the capacitor and the operational amplifier form a second integration circuit, the plurality of switches are connected to signal input selecting paths and the charge/discharge paths of the capacitor, thereby selecting an input signal and controlling charge/discharge times of the capacitor.

Referring still to FIGS. 3A and 3B, when a timing signal k1 for controlling a plurality of first charge switches (e.g. first switches 311A and 311B, second switches 312A and 312B, third switches 313A and 313B and fourth switches 314A and 314B) is a positive pulse, sensing signals on the path 0 and path 1 charge the first capacitors C1A and C1B and the second capacitors C2A and the C2B (as indicated by solid-line paths), that is, the two first S/H circuits perform sampling on the sensing signals of the two corresponding sensors via the paths 0 and 1, respectively. When a timing signal k2 for controlling a plurality of first discharge switches (e.g. fifth switches 315A and 315B, sixth switches 316A and 316B, seventh switches 317A and 317B and eighth switches 318A and 318B) is a positive pulse, the first capacitors C1A and C1B and the second capacitors C2A and C2B discharge to the second S/H circuits (as indicated by dotted-line paths), that is, the two first S/H circuits output sampled and held results. In this embodiment, three k1 positive pulses are followed by 1 k2 positive pulse, in other words, the first S/H circuits in this embodiment performs 3 samplings in short durations, accumulates them and then outputs the result to the second S/H circuits. The number of short-duration samplings for accumulation performed by the first S/H circuits can be adjusted according to actual needs, and the present invention is not limited to this. In addition, based on the discharge paths of the first capacitors C1A and C1B and the second capacitors C2A and C2B, the first S/H circuits in this embodiment outputs both positive and negative sampled results to the second S/H circuit. For example, the first capacitor C1A outputs a positive sampled result to the first selecting switch 331A via the sixth switch 316A using Vdd/2 as a reference potential; and the second capacitor C2A outputs a negative sampled result to the third selecting switch 333A via the seventh switch 317A using Vdd/2 as a reference potential. Similarly, the first capacitor C1B outputs a positive sampled result to the first selecting switch 331B via the sixth switch 316B using Vdd/2 as a reference potential; and the second capacitor C2B outputs a negative sampled result to the third selecting switch 333B via the seventh switch 317B using Vdd/2 as a reference potential, and the first capacitor C1B further outputs the positive sampled result to the second selecting switch 333A and the negative sampled result to the fourth selecting switch 334A.

Referring again to FIGS. 3A and 3B, when a timing signal k0$b$ for controlling a plurality of clear switches (e.g. ninth switches 319A and 319B and tenth switches 320A and 320B) is a positive pulse, the first capacitors C1A and C1B and the second capacitors C2A and C2B are discharged and cleared. In this embodiment, a k0$b$ positive pulse appears before every three k1 positive pulses and after every k2 positive pulse. This means that before the first S/H circuits perform the multistage samplings and accumulations, and after the first sampled signals are outputted, the first capacitors C1A and C1B and the second capacitors C2A and C2B are cleared to ensure no residual charge will affect the next sampled results. Sample control switches 321A and 321B are controlled with the inversion of the timing signal k1, so that when the sample control switches 321A and 321B are conducting, the first S/H circuits, the first S/H circuits will be unable to perform samplings and accumulations.

Referring again to FIGS. 3A and 3B, when timing signals k0$w$0 and k0$w$1 for controlling second charge switches (e.g. eleventh switches 335A and 335B and twelfth switches 336A and 336B) and a timing signal p1 for controlling the first selecting switches 331A and 331B and the fourth selecting switches 334A and 334B are positive pulses, then the positive sampled result from the first capacitor C1A and the negative sampled result from the adjacent second capacitor C2B will simultaneously charge the third capacitor C0. Similarly, the positive sampled result from the first capacitor C1B and the negative sampled result from another adjacent second capacitor will simultaneously charge the third capacitor C1. In other words, the two second S/H circuits each simultaneously receives a positive first sampled signal outputted from its corresponding first S/H circuit and a negative first sampled signal outputted from its adjacent first S/H circuit. Since adjacent or nearby sensors in the touch panels often have similar sensing noise, so through the above process of obtaining the differences, the sensing noise in the positive and negative first sampled signals will cancel out each other, that is, the two second S/H circuits will receive sampled sensing values with low noise.

Referring again to FIGS. 3A and 3B, when the timing signals k0$w$0 and k0$w$1 for controlling second charge switches (e.g. eleventh switches 335A and 335B and twelfth switches 336A and 336B) and a timing signal p2 for controlling the second selecting switches 332A and 332B and the third selecting switches 333A and 333B are positive pulses, then the negative sampled result from the second capacitor C2A and the positive sampled result from the adjacent first capacitor C1B will simultaneously charge the third capacitor C0. Similarly, the negative sampled result from the second capacitor C2B and the positive sampled result from another adjacent first capacitor will simultaneously charge the third capacitor C1. In other words, the two second S/H circuits each simultaneously receives a negative first sampled signal outputted from its corresponding first S/H circuit and a positive first sampled signal outputted from its adjacent first S/H circuit. Through this process of obtaining the differences, the sensing noise in the positive and negative first sampled signals will cancel out each other, that is, the two second S/H circuits will receive sampled sensing values with low noise.

In this embodiment, the timing signal p1 and the timing signal p2 are signals with the same frequency but 180 degrees out of phase. If the timing signal p1 is regarded as the operating timing signal, then the present embodiment can operate in both the positive and negative pulses of the timing signal p1. Furthermore, in this embodiment, after 10 p1 cycles (20 half cycles), the timing signals k0w0 and k0w1 for controlling the second charge switches (e.g. eleventh switches 335A and 335B and twelfth switches 336A and 336B) sequentially change from positive to a low voltage potential, and timing signals k0c0 and k0c1 for controlling second discharge switches (e.g. thirteenth switches 335A and 335B and fourteenth switches 336A and 336B) sequentially change from a low voltage potential to positive, the third capacitors C0 and C1 sequentially discharge to the AD converter 250 via the fourteenth switches 336A and 336B using Vdd/2 as the reference potential, that is, the two second S/H circuit finishes sampling and sequentially output S/D results to the AD converter 250 for conversion.

Figure 3C:
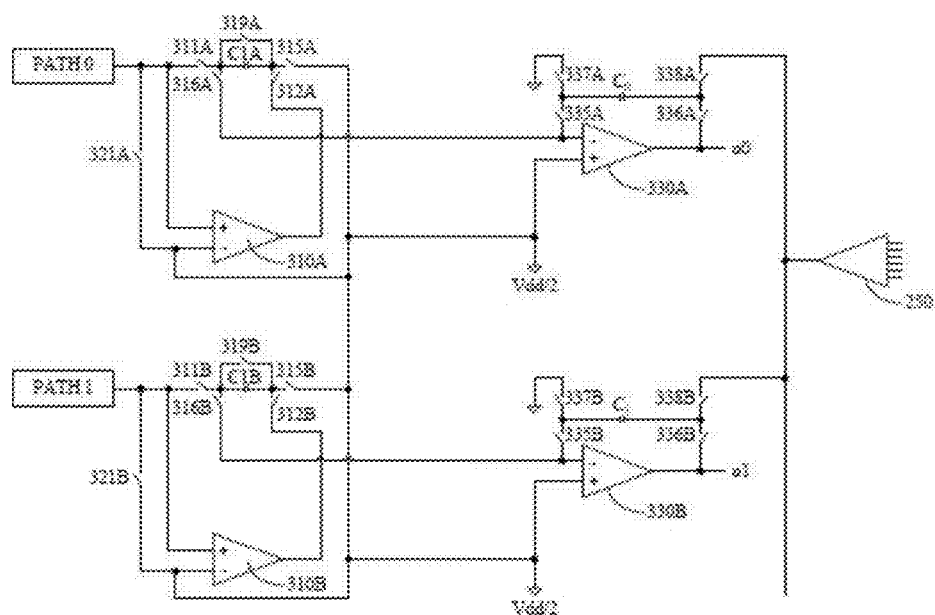
FIG. 3C is a diagram illustrates components of another sensor circuit module in accordance with an embodiment of the present invention.
Figure 3D:
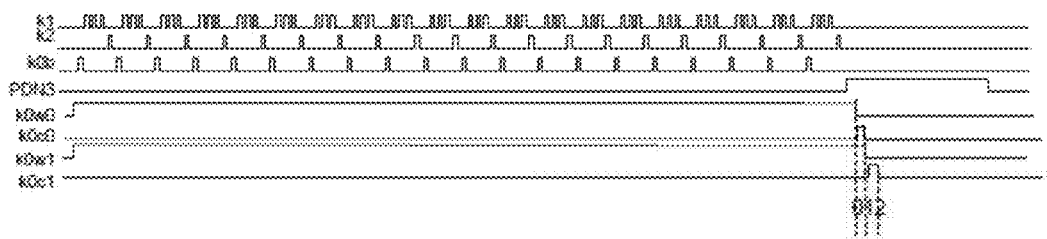
FIG. 3D is a waveform diagram of the sensor circuit module shown in the FIG. 3C.

Referring to FIGS. 3C and 3D, a circuit diagram and a timing diagram of a preferred circuit according to the embodiment described in FIG. 1A are shown, respectively. Basically, the embodiment shown in FIG. 3C simplifies some functions and elements of the embodiment shown in FIG. 3A. The difference between the two is in that each first S/H circuit of the embodiment shown in FIG. 3C uses only one capacitor and the relevant charge/discharge switches. That is, each first S/H circuit contains one operational amplifier (e.g. first operational amplifier 310A and 310B), a capacitor (e.g. a first capacitor C1A or C1B) and a plurality of switches (e.g. 311A, 312A, 315A, 316A, 319A and 321A or 311B, 312B, 315B, 316B, 319B and 321B), wherein the capacitor and the operational amplifier form a first integration circuit, and the plurality of switches correspond to the charge/discharge paths connected with the capacitor, thereby controlling the charge/discharge times of the capacitor. Also, each second S/H circuit does not contain the selecting switches (e.g. 331A, 332A, 333A and 334A or 331B, 332B, 333B and 334B) in FIG. 3A, but instead is directly coupled to the output of the corresponding first S/H circuit. That is, each second S/H circuit includes an operational amplifier (e.g. a second operational amplifier 330A or 330B), a capacitor (e.g. a third capacitor C0 or C1) and a plurality of switches (335A, 336A, 337A and 338A or 335B, 336B, 337B and 338B), wherein the capacitor and the operational amplifier form a second integration circuit and the plurality of switches correspond to the charge/discharge paths connected with the capacitor, thereby controlling charge/discharge times of the capacitor.

Referring still to FIGS. 3C and 3D, when a timing signal k1 for controlling a plurality of first charge switches (e.g. first switches 311A and 311B and second switches 312A and 312B) is a positive pulse, sensing signals on the path 0 and path 1 charge the first capacitors C1A and C1B, that is, the two first S/H circuits perform sampling on the sensing signals of the two corresponding sensors via the paths 0 and 1, respectively. When a timing signal k2 for controlling a plurality of first discharge switches (e.g. fifth switches 315A and 315B and sixth switches 316A and 316B) is a positive pulse, the first capacitors C1A and C1B discharge to the second S/H circuits, that is, the two first S/H circuits output sampled and held results. In this embodiment, three k1 positive pulses are followed by 1 k2 positive pulse, in other words, the first S/H circuits in this embodiment performs 3 samplings in short durations, accumulates them and then outputs the result to the second S/H circuits. The number of short-duration samplings for accumulation performed by the first S/H circuits can be adjusted according to actual needs, and the present invention is not limited to this. In contrast to the embodiment of FIG. 3A, the first S/H circuits of this embodiment does not output both positive and negative sampled results at the same time, that is, the two S/H circuits only output positive sampled results to corresponding second S/H circuits via the sixth switches 316A and 316B by the two first capacitors C1A and C1B using Vdd/2 as the reference potential via the fifth switches 315A and 315B. As for the clear switches (e.g. ninth switches 319A and 319B) and its control timing signal k0b and sample control switches 321A and 321B and its controlling timing signal (inverted k1) are the same as those described in FIGS. 3A and 3B, and will not be repeated.

Referring again to FIGS. 3C and 3D, when timing signals k0w0 and k0w1 for controlling second charge switches (e.g. eleventh switches 335A and 335B and twelfth switches 336A and 336B) are positive pulses, then the positive sampled result from the first capacitor C1A and C1B will charge the third capacitor C0 and C1, respectively. In other words, the two second S/H circuits each receives a positive first sampled signal outputted from its corresponding first S/H circuit. Unlike the embodiment shown in FIG. 3A, the second S/H circuits of the present embodiment only receives positive first sampled signals of the corresponding first S/H circuits, and thus this embodiment is not capable of eliminating the noise using the differences as above, but is capable of reducing saturation as a result of the instantaneous noise being too large. As for the operations of discharging the third capacitors C0 and C1 to an AD converter 250 and of the relevant switches (e.g. eleventh switches 335A and 335B, twelfth switches 336A and 336B, thirteenth switches 337A and 337B, fourteenth switches 338A and 338B) and timing signals (e.g. k0w0, k0w1, k0c0 and k0c1) are the same as those described in FIGS. 3A and 3B, and will not be repeated.

Figure 3E:
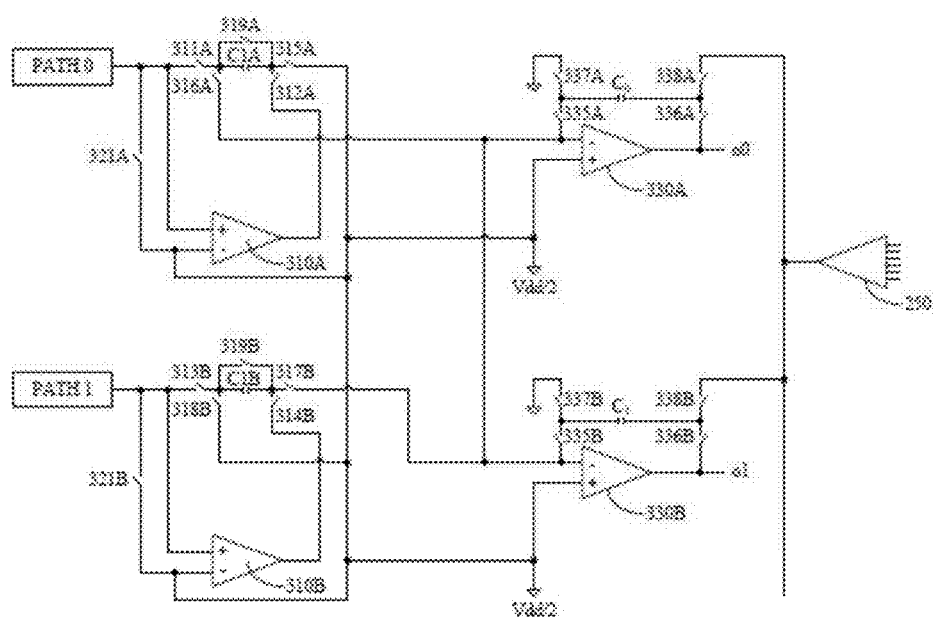
FIG. 3E is a diagram illustrates components of another sensor circuit module in accordance with an embodiment of the present invention.

Referring to FIGS. 3E and 3D, a modified circuit and a timing diagram of the embodiment described in FIG. 3C are shown. In principle, the embodiment shown in FIG. 3E adds the function of eliminating the noise by differences to the embodiment shown in FIG. 3C. The two embodiments are different in that the first S/H circuits of the embodiment of FIG. 3E does not output first sampled signals with always the same polarity, but providing first sampled signals with opposite polarities. Take the paths 0 and 1 as an example, the first S/H circuit includes an operational amplifier (e.g. a first operational amplifier 310A or 310B), a capacitor (e.g. a first capacitor C1A or a second capacitor C2B) and a plurality of switches (e.g. 311A, 312A, 315A, 316A, 319A, and 313B, 314B, 317B, 318B, 319B and 321B), wherein the capacitor and the operational amplifier form a first integration circuit and the plurality of switches correspond to charge/discharge paths connected with the capacitor, thereby controlling the charge/discharge times of the capacitor. Also, the second S/H circuits not only receive the output from the corresponding first S/H circuits, but also receive an output of the opposite polarity from a first S/H circuit on an adjacent path, and each second S/H circuit includes an operational amplifier (e.g. a second operational amplifier 330A or 330B), a capacitor (e.g. a third capacitor C0 or C1) and a plurality of switches (e.g. 335A, 336A, 337A and 338A or 335B, 336B, 337B and 338B), wherein the capacitor and the operational amplifier form a second integration circuit, and the plurality of switches are connected to charge/discharge paths connected with the capacitor, thereby controlling charge/discharge times of the capacitor.

Referring still to FIGS. 3E and 3D, when a timing signal k1 for controlling a plurality of first charge switches (e.g. a first switch 311A, a second switch 312A, a third switch 313A and a fourth switch 314A) is a positive pulse, sensing signals on the path 0 and path 1 charge the first capacitor C1A and the second capacitor C2B, respectively. That is, the two first S/H circuits perform sampling on the sensing signals of the two corresponding sensors via the paths 0 and 1, respectively. When a timing signal k2 for controlling a plurality of first discharge switches (e.g. a fifth switch 315A, a sixth switch 316A, a seventh switch 317B and an eighth switch 318B) is a positive pulse, the first capacitor C1A and the second capacitor C2B discharge to the second S/H circuits, that is, the two first S/H circuits output sampled and held results. In this embodiment, three k1 positive pulses are followed by 1 k2 positive pulse, in other words, the first S/H circuits in this embodiment performs 3 samplings in short durations, accumulates them and then outputs the result to the second S/H circuits. The number of short-duration samplings for accumulation performed by the first S/H circuits can be adjusted according to actual needs, and the present invention is not limited to this. In contrast to the embodiment of FIG. 3C, adjacent first S/H circuit outputs a sampled result with an opposite polarity, that is, the first capacitor C1A outputs a positive sampled result to the corresponding second S/H circuit via the sixth switch 316A using Vdd/2 as the reference potential via the fifth switch 315A, and the second capacitor C2B outputs a negative sampled result to the corresponding second S/H circuit via the seventh switch 317B using Vdd/2 as the reference potential via the eighth switch 318B. As for the clear switches (e.g. a ninth switch 319A and 319B) and its control timing signal k0b and sample control switches 321A and 321B and its controlling timing signal (inverted k1) are the same as those described in FIGS. 3A and 3B, and will not be repeated.

Referring again to FIGS. 3E and 3D, when timing signals k0w0 and k0w1 for controlling second charge switches (e.g. eleventh switches 335A and 335B and twelfth switches 336A and 336B) are positive pulses, then the positive sampled result from the first capacitor C1A and the negative sampled result from the second capacitor C2B on the adjacent path will simultaneously charge the third capacitor C0. Similarly, the negative sampled result from the second capacitor C2B and a positive sampled result from a first capacitor on another adjacent path will simultaneously charge the third capacitor C10. In other words, the two second S/H circuits each receives a positive (a negative) first sampled signal outputted from its corresponding first S/H circuit and also a negative (a positive) first sampled signal outputted from the first S/H circuit on the adjacent path. Since adjacent or nearby sensors in the touch panels often have similar sensing noise, so through the above process of obtaining the differences, the sensing noise in the positive and negative first sampled signals will cancel out each other, that is, the two second S/H circuits will receive sampled sensing values with low noise. Based on the above, this embodiment not only eliminates the sensing noise by the method of differences, but also reduces saturation resulting from the instantaneous noise being too large. As for the operations of discharging the third capacitors C0 and C1 to an AD converter 250 and of the relevant switches (e.g. eleventh switches 335A and 335B, twelfth switches 336A and 336B, thirteenth switches 337A and 337B, fourteenth switches 338A and 338B) and timing signals (e.g. k0w0, k0w1, k0c0 and k0c1) are the same as those described in FIGS. 3A and 3B, and will not be repeated. It should be noted that in this embodiment the first sampled signals are provided with opposite polarities, although this can eliminate noise by obtaining the differences, but the result output by the second S/H circuits will also exhibit opposite polarities. This can be corrected by using an inverter, which is well known to one with ordinary skill in the art, and will not be further discussed.

Figure 4:
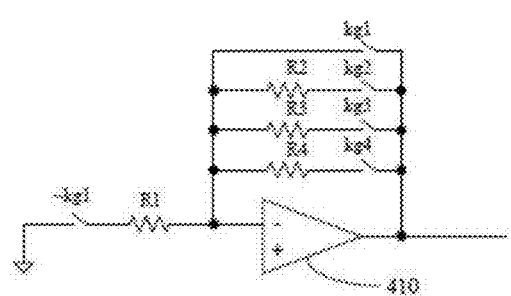
FIG. 4 is a diagram depicts an amplifier shown in the FIG. 2.

Referring to FIG. 4, a circuit diagram illustrating a preferred circuit of the buffer amplifier 270 described with respect to FIG. 2 is shown. A plurality of multiplying resistors R2, R3 and R4 are connected with respective multiplying switches kg2, kg3 and kg4 in series, and are connected in parallel with each other as well as another multiplying switch kg1, these then form a non-inverting amplifier circuit structure with a third operational amplifier 410, a reference resistor R1 and a reference switch ~kg1. When the multiplying switch kg1 is shorted and the reference switch ~kg1 and the rest of the multiplying resistors kg2 to kg4 are opened, the amplifying ratio of the third operational amplifier 410 is 1. When the multiplying switch kg2 and the reference switch ~kg1 are shorted while the rest of the multiplying resistors are opened, the amplifying ratio of the third operational amplifier 410 is (R1+R2)/R1. Similarly, it can be derived that the third operational amplifier 410 may also have amplifying ratios of (R1+R3)/R1 and (R1+R4)/R1, so by replacing the feedback circuit with different resistances, different amplifying ratios can be achieved.

Figure 5A:
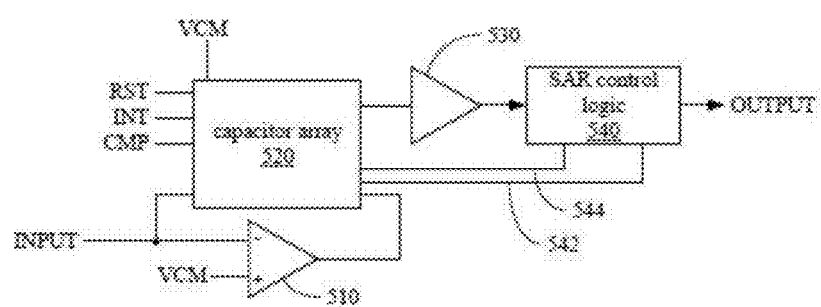
FIG. 5A is a diagram depicts a successive approximation register analog to digital converter (SAR-ADC) in accordance with an embodiment of the present invention.
Figure 5B:
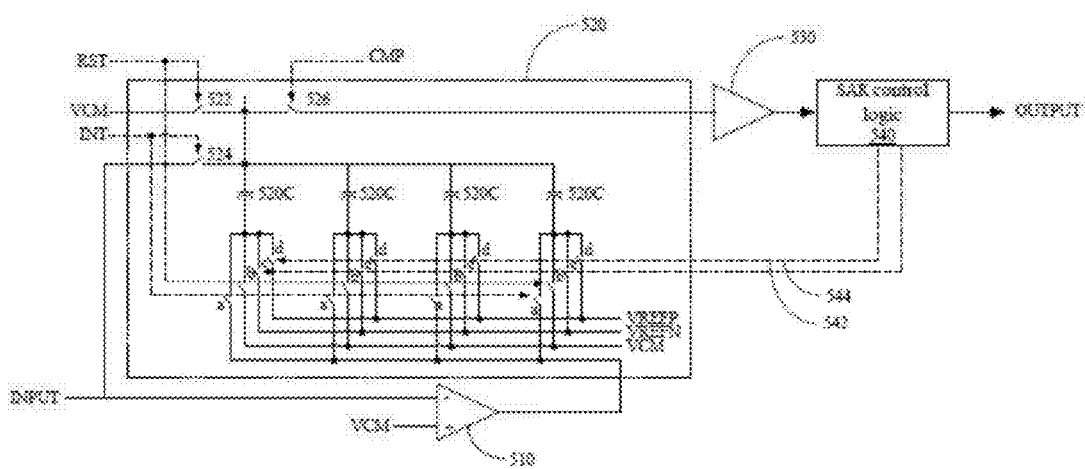
FIG. 5B is a diagram shows components of the SAR-ADC shown in the FIG. 5A.
Figure 5C:
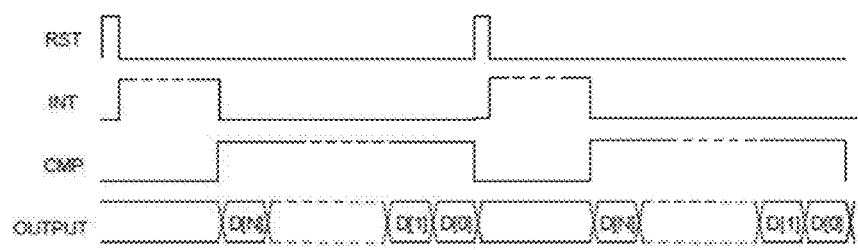
FIG. 5C is a waveform diagram of the SAR-ADC shown in the FIG. 5A.

Referring to FIGS. 5A and 5C, a block diagram and a timing diagram for a preferred sampling and conversion embodiment combining the second S/H circuits 230 and the AD converter 250 described with respect to FIG. 2 are shown, respectively. An operational amplifier 510 and a capacitor array 520 form a third integration circuit (corresponding to the second S/H circuits 230 in FIG. 2), and a voltage VCM is used as the reference voltage. The capacitor array 520 and a comparator 530 and a successive approximation register (SAR) control logic 540 form a SAR AD converter (SAR-ADC) (corresponding to the AD converter 250 in FIG. 2), and is controlled by a plurality of controlling signals (e.g. RST, INT and CMP). When the first control signal RST is positive, all the capacitors in the capacitor array 520 will be reset (i.e. charges in the capacitors will resume default values, typically zero, but not limited to this). When a second control signal INT is at a high potential, the third integration circuit formed by the operational amplifier 510 and the capacitor array 520 performs integration, that is, performs S/H operations (e.g. in FIG. 2, the second S/H circuits 230 sample the first S/H circuits 210). When a third control signal CMP is high, the SAR-ADC formed by the capacitor array 520, the comparator 530 and the SAR control logic 540 performs successive approximation analog-to-digital conversion on the results sampled and held by the capacitor array 520, thereby converting the S/H results from analog to digital form, wherein the SAR control logic 540 further provides two output control signals 542 and 544 for controlling outputs as ascending output (output from LSB to MSB) or descending output (output from MSB to LSB).

Referring to FIG. 5B, a circuit diagram illustrating a preferred circuit of FIG. 5A is shown. The operational amplifier 510 and the capacitor array 520 including a plurality of capacitors 520C connected in parallel form the third integration circuit, and the voltage VCM is used as the reference voltage of the operational amplifier 510, wherein the first end of each capacitor 520C is electrically coupled to three control switches (e.g. 522, 524 and 526), which are a first control switch 522 that can be electrically coupled to the reference voltage VCM under the control of the first control signal RST; a second control switch 524 that can be electrically coupled to the input under the control of the second control signal INT; and a third control switch 526 that can be electrically coupled to the input of the comparator 530 under the control of the third control signal CMP, respectively. A second end of each capacitor 520C can be serially connected to a plurality of parallel switches a, b, c and d to selectively and electrically couple with the output end of the operational amplifier 510 and a plurality of reference voltages (e.g. VCM, VREFN and VREFP). The capacitor array 520, the comparator 530 and the SAR control logic 540 form the SAR-ADC and are under the control of the control signals RST, INT and CMP.

Referring to FIGS. 5B and 5C, when the first control signal RST controlling the first control switch 522 and the plurality of switches b is positive, then the first control switch 522 and the plurality of switches b are turned on, so both ends of all of the capacitors 520C in the capacitor array 520 are connected to the reference voltage VCM, that is, charges inside all of the capacitors 520C will be reset to the default value (typically zero, but not limited to this). When the second control signal INT controlling the second control switch 524 and the plurality of switches a is at a high potential, then the second control switch 524 and the plurality of switches a are turned on, so the operational amplifier 510 and all the capacitors in the capacitor array 520 form the third integration circuit (corresponding to the second S/H circuits 230 in FIG. 2) and perform integration operations, that is, perform S/H operations on the input (corresponding to the second S/H circuits 230 sampling the first S/H circuits 210 in FIG. 2). When the third control signal CMP is at a high potential, the third control switch 526 is turned on, and the SAR-ADC formed by the capacitor array 520, the comparator 530 and the SAR control logic 540 performs successive approximation analog-to-digital conversion on the results sampled and held by the capacitor array 520, thereby converting the data form of the output, wherein the SAR control logic 540 provides two output control signals 542 and 544 for respectively controlling a plurality of switches c so that the reference voltage VREFN becomes the conversion reference voltage and controlling a plurality of switches d so that the reference voltage VREFP becomes the conversion reference voltage, resulting in an descending output (output from MSB to LSB) and an ascending output (output from LSB to MSB) respectively.

Figure 5D:
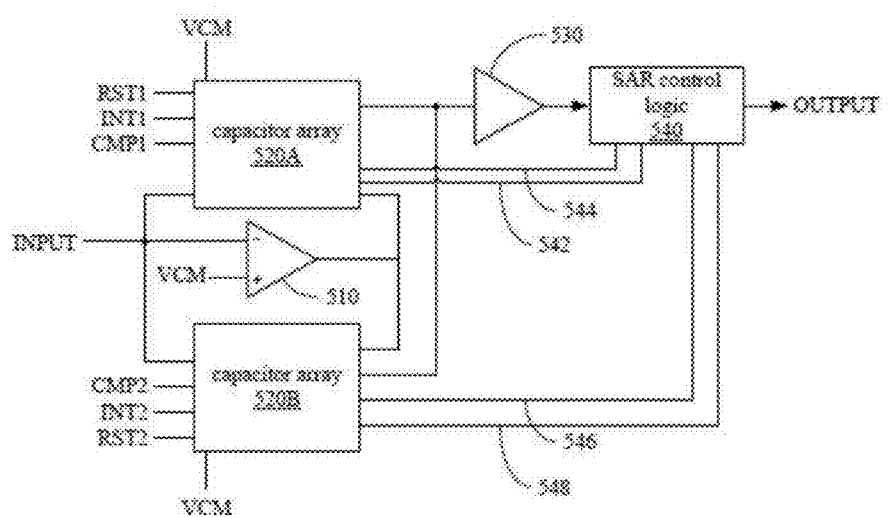
FIG. 5D is a diagram depicts another successive approximation register analog to digital converter (SAR-ADC) in accordance with an embodiment of the present invention.
Figure 5E:
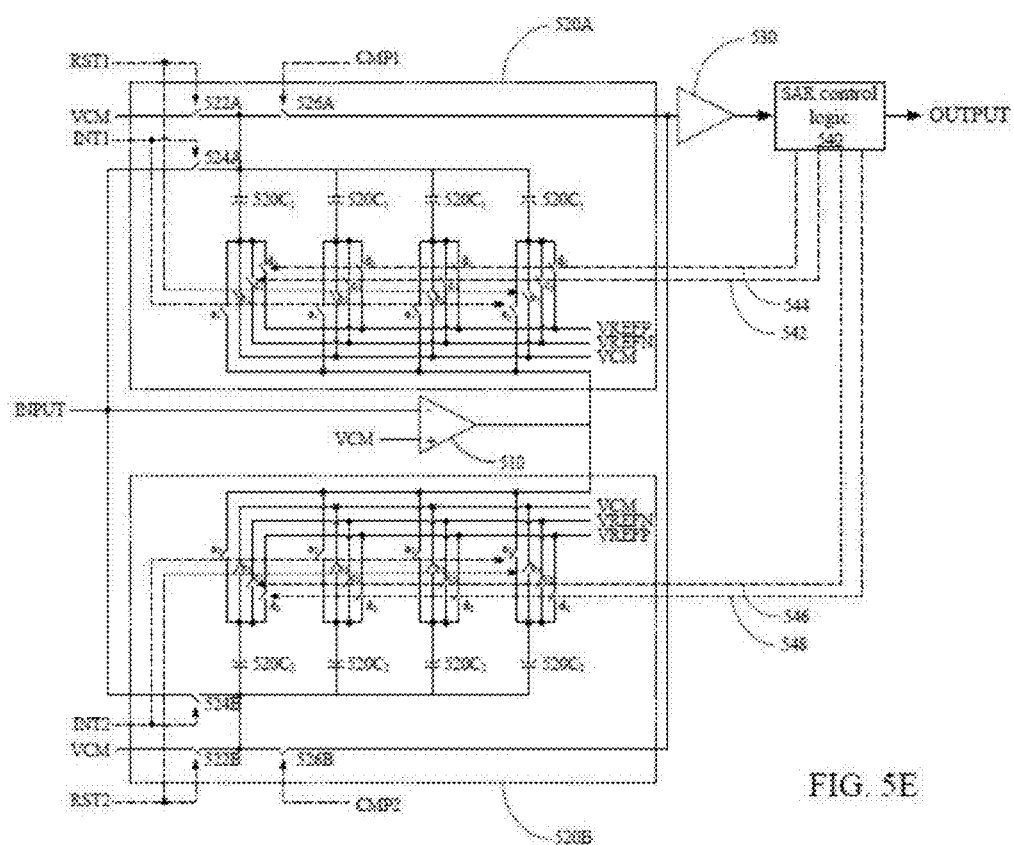
FIG. 5E is a diagram shows components of the SAR-ADC shown in the FIG. 5D.
Figure 5F:
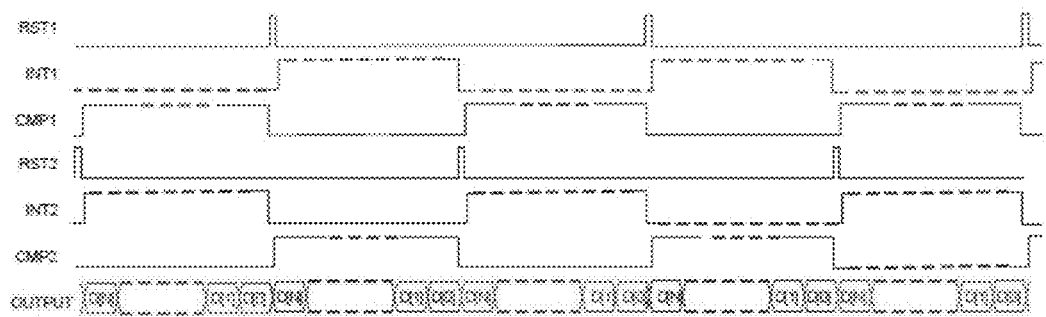
FIG. 5F is a waveform diagram of the SAR-ADC shown in the FIG. 5D.

Referring to FIGS. 5D and 5F, a block diagram and a timing diagram for a modified circuit of the embodiment in FIG. 5A are shown, respectively. Basically, the embodiment in FIG. 5D achieves the operations of the embodiment in FIG. 5A by a time-division pipelining manner. The two embodiments are different in that the embodiment in FIG. 5D further adds another capacitor array and the relevant control signals. That is, an operational amplifier 510 and two capacitor array 520A and 520B form a third integration circuit at different times, and a voltage VCM is used as the reference voltage. Said different times are controlled by controlling signals and control switches, so that the operational amplifier 510 forms the third integration circuit with the only one of the capacitor arrays 520A and 520B at any one time. The capacitor arrays 520A and 520B also form a SAR-ADC with a comparator 530 and a SAR control logic 540 at different times, and are controlled by a plurality of control signals (e.g. RST1, INT1, CMP1 and RST2, INT2, CMP2). Similarly, said different times are controlled by controlling signals and control switches, so that only one of the capacitor arrays 520A and 520B forms the SAR-ADC with the comparator 530 and the SAR control logic 540 at any one time. Based on the above, in this embodiment, when the capacitor array 520A forms the third integration circuit with the operational amplifier 510 for performing integration operations, the capacitor array 520B forms the SAR-ADC with the comparator 530 and the SAR control logic 540 for performing AD conversion. Whereas when the capacitor array 520B forms the third integration circuit with the operational amplifier 510 for performing integration operations, the capacitor array 520A forms the SAR-ADC with the comparator 530 and the SAR control logic 540 for performing AD conversion. Thus, when a first control signal RST1 is positive, then all the capacitors in the capacitor array 520A will be reset (charges inside all of the capacitors will resume the default value, typically zero, but not limited to this). Then, when a second control signal INT1 is at a high potential, then the capacitor array 520A and the operational amplifier 510 form the third integration circuit and perform integration operations, that is, perform S/H operations on the input, meanwhile, a sixth control signal CMP2 is at a high potential, so the SAR-ADC formed by the capacitor array 520B, the comparator 530 and the SAR control logic 540 performs successive approximation analog-to-digital conversion on the results sampled and held by the capacitor array 520B. Then, when a fourth control signal RST2 is positive, all the capacitors in the capacitor array 520B will be reset (charges inside all of the capacitors will resume the default value, typically zero, but not limited to this), and then when a third control signal CMP1 is at a high potential, the SAR-ADC formed by the capacitor array 520A, the comparator 530 and the SAR control logic 540 performs successive approximation analog-to-digital conversion on the results sampled and held by the capacitor array 520A. Meanwhile, a fifth control signal INT2 is at a high potential, so the capacitor array 520B and the operational amplifier 510 form the third integration circuit and perform integration operations, that is, perform S/H operations on the input. By repeating the above processes of the control signals, this embodiment can be realized in a time-division pipelining manner, which speeds up the sampling and conversion processes. In addition, the SAR control logic 540 further provides two output control signals 546 and 548 for controlling the converted outputs of the capacitor array 520A and 520B to be descending output (output from MSB to LSB) or ascending output (output from LSB to MSB).

Referring to FIG. 5E, a circuit diagram illustrating a preferred circuit of FIG. 5D is shown. The operational amplifier 510 and the capacitor array 520A including a plurality of capacitors $520C_1$ connected in parallel form the third integration circuit, and the voltage VCM is used as the reference voltage of the operational amplifier 510, wherein the first end of each capacitor $520C_1$ is electrically coupled to three control switches (e.g. 522A, 524A and 526A), which are a first control switch 522A that can be electrically coupled to the reference voltage VCM under the control of the first control signal RST1; a second control switch 524A that can be electrically coupled to the input under the control of the second control signal INT1; and a third control switch 526A that can be electrically coupled to the input of the comparator 530 under the control of the third control signal CMP1, respectively. A second end of each capacitor $520C_1$ can be serially connected to a plurality of parallel switches a1, b1, c1 and d1 to selectively and electrically couple with the output end of the operational amplifier 510 and a plurality of reference voltages (e.g. VCM, VREFN and VREFP). In addition, the capacitor array 520A, the comparator 530 and the SAR control logic 540 form the SAR-ADC and are under the control of the control signals RST1, INT1 and CMP1. The operational amplifier 510 and the capacitor array 520B including a plurality of capacitors $520C_2$ connected in parallel also form the third integration circuit, and the voltage VCM is used as the reference voltage of the operational amplifier 510, wherein the first end of each capacitor $520C_2$ is electrically coupled to three control switches (e.g. 522B, 524B and 526B), which are a fourth control switch 522B that can be electrically coupled to the reference voltage VCM under the control of the fourth control signal RST2; a fifth control switch 524B that can be electrically coupled to the input under the control of the fifth control signal INT2; and a sixth control switch 526B that can be electrically coupled to the input of the comparator 530 under the control of the sixth control signal CMP2, respectively. A second end of each capacitor $520C_2$ can be serially connected to a plurality of parallel switches $a_2$, $b_2$, $c_2$ and $d_2$ to selectively and electrically couple with the output end of the operational amplifier 510 and a plurality of reference voltages (e.g. VCM, VREFN and VREFP). In addition, the capacitor array 520B, the comparator 530 and the SAR control logic 540 also form the SAR-ADC and are under the control of the control signals RST2, INT2 and CMP2.

Referring to FIGS. 5E and 5F, when the first control signal RST1 controlling the first control switch 522A and the plurality of switches $b_1$ is positive, then the first control switch 522A and the plurality of switches $b_1$ are turned on, so both ends of all of the capacitors $520C_1$ in the capacitor array 520A are connected to the reference voltage VCM, that is, charges inside all of the capacitors $520C_1$ will be reset to the default value (typically zero, but not limited to this). When the second control signal INT1 controlling the second control switch 524A and the plurality of switches al is at a high potential, then the second control switch 524A and the plurality of switches al are turned on, so the operational amplifier 510 and all the capacitors in the capacitor array 520A form the third integration circuit (corresponding to the second S/H circuits 230 in FIG. 2) and perform integration operations, that is, perform S/H operations on the input (corresponding to the second S/H circuits 230 sampling the first S/H circuits 210 in FIG. 2). Meanwhile, the sixth controlling signal CMP2 is also at a high potential, so the sixth control switch 526B is turned on, and the SAR-ADC formed by the capacitor array 520B, the comparator 530 and the SAR control logic 540 performs successive approximation analog-to-digital conversion on the results sampled and held by the capacitor array 520B. Then, when the fourth control signal RST2 controlling the fourth control switches 522B and the plurality of switches $b_2$ is positive, the fourth control switches 522B and the plurality of switches $b_2$ are turned on, and all the capacitors $520C_2$ in the capacitor array 520B are connected to the reference voltage VCM, that is, charges inside all of the capacitors $520C_2$ will resume the default value (typically zero, but not limited to this). Thereafter, when the third control signal CMP1 is at a high potential, the third control switch 526A is turned on, and the SAR-ADC formed by the capacitor array 520A, the comparator 530 and the SAR control logic 540 performs successive approximation analog-to-digital conversion on the results sampled and held by the capacitor array 520A. Meanwhile, the fifth control signal INT2 controlling the fifth control switches 524B and the plurality of switches $a_2$ is at a high potential, so the fifth control switches 524B and the plurality of switches a2 are turned on, and thus all the capacitors $520C_2$ in the capacitor array 520B and the operational amplifier 510 form the third integration circuit (corresponding to the second S/H circuits 230 in FIG. 2) and perform integration operations, that is, perform S/H operations on the input. By repeating the above processes of the control signals, the two capacitor array 520A and 520B in this embodiment can time share the operational amplifier 510, the comparator 530 and the SAR control logic 540, thus achieving time-division pipelining operations. In other words, when the capacitor array 520A forms the third integration circuit with the operational amplifier 510 for performing integration operations, the capacitor array 520B forms the SAR-ADC with the comparator 530 and the SAR control logic 540 for performing AD conversion; whereas when the capacitor array 520B forms the third integration circuit with the operational amplifier 510 for performing integration operations, the capacitor array 520A forms the SAR-ADC with the comparator 530 and the SAR control logic 540 for performing AD conversion, thereby increasing the overall operational speed. In addition, the SAR control logic 540 further provides output control signals 542, 546 and 544, 548 for respectively controlling a plurality of switches $c_1$ and $c_2$ so that the reference voltage VREFN becomes the conversion reference voltage, and controlling a plurality of switches $d_1$ and $d_2$ so that the reference voltage VREFP becomes the conversion reference voltage, resulting in an descending output (output from MSB to LSB) and an ascending output (output from LSB to MSB) respectively.

Finally, it should be noted that the present invention provides circuits for holding positive and negative sampled signals are provided using a combination of two capacitors and an operational amplifier, and the above circuits are combined to sample and hold a plurality of differences of a plurality of paths (a plurality of sensors (or conductive strips) in a touch panel) (e.g. sampled values of path 2 minus sampled values of path 1, sampled values of path 3 minus sampled values of path 2, . . . , sampled values of path m minus sampled values of path m−1; or,sampled values of path 1 minus sampled values of path 2, sampled values of path 2 minus sampled values of path 3, . . . , sampled values of path m−1 minus sampled values of path m). This architecture is used for mutual capacitive detection, that is, sensors in one of the horizontal and vertical directions are driven (sequentially driven), and at the same time, signals from all the sensors in the other of the horizontal and vertical directions are received (all at the same time or in several stages). When each sensor is driven, sensors in the other direction are then sampled. The S/H circuits proposed by the present invention are used for latching all the signals, so that common mode noise with fixed frequencies coming from the display can then be removed by obtaining the differences of the signals.

In addition, the timing for performing S/H by the first S/H circuits can fall on the times when the display emits no or very low noise. The selection of the clock frequency can be made by testing with several predetermined frequencies, or combinations of different frequencies and timings, so that an appropriate combination of the frequency and the timing can be determined. The determination of whether frequency should be selected or changed can be made once at the beginning or regularly during the operation.

Please refer to FIG. 5A to 5C. In one embodiment of the present invention, an integration and analog to digital conversion circuit sharing common capacitors is provided. The circuit comprises a capacitor array module 520, an integration circuit, and an analog to digital conversion (ADC) logic (530 and 540 collectively). The capacitor array module 520 comprises a plurality of capacitors 520C. The integration circuit integrates an analog signal (INPUT shown in the FIG. 5A.) The ADC logic converts the output of the capacitor array module 520 to a digital signal (OUTPUT shown in the FIG. 5A.)

The integration circuit comprises an OP amplifier, which has a first input end, a second input end, and an output end. The first input end is coupled to the analog signal. The second input end is coupled to a reference signal (for example, a reference voltage VCM.) The first input end and the output end of the OP amplifier are coupled in parallel to both ends of each of capacitor 520C, respectively. In other words, at least part of all capacitors 520C is used for integration. The two ends of those capacitors used for integration are coupled to the input end and the output end of the integration circuit in parallel, respectively. The integration circuit is configured to integrate the analog signal according to the reference signal.

The ADC logic further comprises a comparator 530. The ADC logic, in turn, controls each of the plurality of capacitors 520C configured for integration to output of the comparator 530 for converting the outputs of the plurality of capacitors 520C to the digital signal. The integration circuit takes control of the capacitor array module 520 when performing integration and the ADC logic takes control of the capacitor array module 520 when performing conversion. The performing integration and the performing conversion are in turn.

Please refer to FIG. 5A to 5C. In one embodiment of the present invention, an analog to digital converter (ADC) is provided. The ADC is configured to integrate an input signal and to convert it to a digital n-bit signal (OUTPUT shown in the FIG. 5A.) The ADC comprises a capacitor array module (520 shown in the FIG. 5A), an OP amplifier (520 shown in the FIG. 5A), a comparator (530 shown in the FIG. 5A), and a control logic (540 shown in the FIG. 5A.) The capacitor array module 520 is configured to receive said input signal and a reference voltage VCM. The capacitor array module comprises a plurality of capacitors (520C shown in the FIG. 5B.) The OP amplifier is configured to receive said input signal and said reference voltage VCM. An output end of said OP amplifier is coupled to said capacitor array module. As shown in the FIG. 5B, first ends of said plurality of capacitors are coupled to said input signal, said reference voltage VCM, or an input end of said comparator. The control logic is configured to receive an output signal of said comparator and to send out said n-bit digital signal and a control signal (542 and 544 collectively shown in the FIG. 5A) to said capacitor array module.

The capacitor array module further receives a reset signal RST. Second ends of said plurality of capacitors are coupled to a reset switch (522 and switch b shown in the FIG. 5B) in parallel. When said reset signal RST is a first signal, said first end of said plurality of capacitors are coupled to said reference voltage VCM and said reset switch is closed. The first end and the second end of said capacitors are connected to said reference voltage VCM.

The capacitor array module further receives an integration signal INT. Second ends of said plurality of capacitors are coupled to a integration switch (524 and switch a shown in the FIG. 5B) in parallel. The integration switch is connected to said output end of said OP amplifier. When said integration signal INT is a first signal, said first end of said plurality of capacitors are coupled to said input signal in parallel and said integration switch is closed. The input signal is integrated by said plurality of capacitors.

The capacitor array module further receives a comparison signal CMP. Second ends of each of said plurality of capacitors are coupled to a first comparison switch and a second comparison switch (switch c and switch d shown in the FIG. 5B.) The first comparison switch is connected to a first reference voltage VREFN and the second comparison switch is connected to a second voltage VREFP. Both the first and second comparison switches are controlled by said control signal. When the comparison signal CMP is a first signal, said first ends of said plurality of capacitors are coupled to said input end of said comparator in parallel. Switch 526 shown in the FIG. 5B is closed. The control logic receives said output of said comparators and to send out said n-bit digital signal and said control signal to said capacitor array module.

The number of said plurality of capacitors is n, and the capacity ratio between capacitors is 2's multiple.

Please refer to FIG. 5A to 5C and FIG. 6A to 6C. In one embodiment of the present invention, an operating method of an analog to digital converter is provided. The analog to digital converter comprises a capacitor array module, an OP amplifier, a comparator, and a control logic. The capacitor array module is configured to receive an input signal and a reference voltage VCM. The capacitor array module comprises a plurality of capacitors. First ends of said plurality of capacitors are coupled to said input signal, said reference voltage VCM, or an input end of said comparator. An output end of said comparator is coupled to said capacitor array module. The said control logic configured to receive an output end of said comparator and send out an n-bit digital signal and a control signal to said capacitor array module.

In one embodiment shown in the FIG. 6A, the operating method comprises: at step 610, coupling said first ends of said plurality of capacitors to said input signal in parallel; and at step 620, coupling second end of said plurality of capacitors to an output end of said OP amplifier in parallel.

In another embodiment shown in the FIG. 6B, the operating method comprises: at step 630, coupling said first ends of said plurality of capacitors to said input end of said comparator in parallel; and at step 640, coupling second ends of said plurality of capacitors to an output end of said OP amplifier in parallel.

In one embodiment shown in the FIG. 6C, the operating method comprises: at step 650, coupling said first ends of said plurality of capacitors to said input end of said comparator in parallel; and at step 660, receiving an output end of said comparator by said logic and sending out said n-bit digital signal and a control signal to said capacitor module.

Second ends of each said plurality of capacitors are coupled to a first comparison switch and a second comparison switch. Said first comparison switch is connected to a first reference voltage VREFN and said second comparison switch is connected to a second reference voltage VRFP. Said first and second comparison switches are controlled by said control signal. And the number of said plurality of capacitors is n. The capacity ratio between capacitors is 2's multiple.

Please refer to FIG. 5D to 5G. In one embodiment of the present invention, an integration and analog to digital conversion circuit sharing common capacitors is provided. The circuit comprises a first capacitor array module 520A, a second capacitor array module 520B, an integration circuit, and an analog to digital conversion (ADC) logic. Both of the first and the second capacitor array modules 520A and 520B comprises a plurality of capacitors $520C_1$ and $520C_2$.

The integration circuit integrates an analog signal (INPUT shown in the FIG. 5D) by the first or the second capacitor array module. The integration circuit comprises an OP amplifier 510. The OP amplifier 510 has a first input, a second input, and an output end. The first input and the second input are connected to the analog signal and a reference signal (for example, reference voltage VCM), respectively. The first input and the output end are coupled to both ends of each of capacitors $520C_1$ and $520C_2$ configured to be integrated in parallel, respectively. In other words, part or all of capacitors $520C_1$ and $520C_2$ are configured to be integrated.

The ADC logic is configured to convert outputs of the first or the second array module (520A or 520B) to a digital signal (OUTPUT shown in the FIG. 5D.) When said ADC logic is performing conversion by said first capacitor array module while said integration circuit is performing integration by said second capacitor array module. When said ADC logic is performing conversion by said second capacitor array module while said integration circuit is performing integration by said first capacitor array module.

Figure 5G:
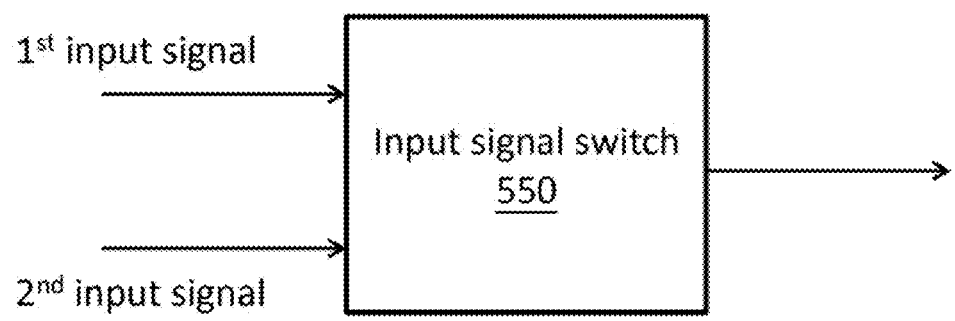
FIG. 5G is a diagram illustrates an input signal switch in accordance with an embodiment of the present invention.

As shown in the FIG. 5G, said analog signal is selected from a plurality of analog inputs and said digital signal is sent to a plurality of digital outputs. The plurality analog inputs are corresponding to said plurality of digital outputs.

Please refer to FIG. 5D to 5G. In one embodiment of the present invention, an analog to digital converter (ADC) is provided. The ADC is configured to integrate a first input signal and a second input signal ($1^{st}$ and $2^{nd}$ input signal shown in the FIG. 5G), respectively, and to convert in turn to a first n-bit digital signal and a second n-bit digital signal (OUTPUT shown in the FIG. 5D.) The ADC comprises an input signal switch (550 shown in the FIG. 5G), a first capacitor array module (520A shown in the FIG. 5D), a second capacitor array module (520B shown in the FIG. 5D), an OP amplifier (510 shown in the FIG. 5D), a comparator (530 shown in the FIG. 5D), and a control logic (530 shown in the FIG. 5D). The input signal switch is configured to receive said first and said second input signals and to send out one of said input signals from an output end, which is further connected to the INPUT shown in the FIG. 5D. The first capacitor array module is configured to couple said output end of said input signal switch and a reference voltage VCM. The first capacitor array module comprises a plurality of first capacitors ($520C_1$ shown in the FIG. 5E). The second capacitor array module is configured to couple said output end of said input signal switch and said reference voltage VCM. The second capacitor array module comprises a plurality of second capacitors ($520C_2$ shown in the FIG. 5E). The OP amplifier configured to couple said output end of said input signal switch and said reference voltage VCM. An output end of said OP amplifier is configured to couple to said first and said second capacitor array modules. The first ends of said plurality of first capacitors are coupled to said output end of said input signal switch, said reference voltage VCM, or an output end of said comparator. The first ends of said plurality of second capacitors are coupled to said output end of said input signal switch, said reference voltage VCM, or an output end of said comparator. The control logic is configured to receive an output signal of said comparator, to send out said n-bit digital signals and a control signal (542, 544, 546, and 548, collectively shown in the FIG. 5E) to said first and said second capacitor array module.

The first capacitor array module further receives a first reset signal RST1. Second ends of said plurality of first capacitors coupled to a first reset switch (switch 522A and switch b1 shown in the FIG. 5E) in parallel which is connected to said reference voltage VCM. When said first reset signal RST1 is a first signal, said first ends of said plurality of first capacitors are coupled to said reference voltage VCM and said first reset switch is closed, whereas said first ends and said second ends of said plurality of first capacitors are connected to said reference voltage.

The second capacitor array module further receives a second reset signal RST2. Second ends of said plurality of second capacitors coupled to a second reset switch (switch 522B and switch b2 shown in the FIG. 5E) in parallel which is connected to said reference voltage VCM. When said second reset signal RST2 is a first signal, said first ends of said plurality of second capacitors are coupled to said reference voltage VCM and said first reset switch is closed, whereas said first ends and said second ends of said plurality of second capacitors are connected to said reference voltage.

The first capacitor array module further receives a first integration signal INT1. Second ends of said plurality of first capacitors coupled to a first integration switch (switch 524A and switch a1 shown in the FIG. 5E) in parallel which is connected to said output end of said OP amplifier. When said first integration signal INT1 is a first signal, said first ends of said plurality of first capacitors are coupled in parallel to said output end of said input signal switch and said first integration switch is closed. The output signal of said input signal switch is integrated by said plurality of first capacitors.

The second capacitor array module further receives a second integration signal INT2. Second ends of said plurality of second capacitors coupled to a second integration switch (switch 524B and switch $a_2$ shown in the FIG. 5E)in parallel which is connected to said output end of said OP amplifier. When said second integration signal INT1 is a first signal, said first ends of said plurality of second capacitors are coupled in parallel to said output end of said input signal switch and said second integration switch is closed. The output signal of said input signal switch is integrated by said plurality of second capacitors.

The first capacitor array module further receives a first comparison signal CMP1. Second ends of said plurality of first capacitors coupled to a first comparison switch (switch $c_1$ shown in the FIG. 5E) and a second comparison switch (switch $d_1$ shown in the FIG. 5E). The first comparison switch is connected to a first reference voltage VREFN and the second comparison switch is connected to a second reference voltage VREFP. The first and said second comparison switch are controlled by said control signal. When said first comparison signal CMP1 is a first signal, said first ends of said plurality of first capacitors are coupled in parallel to said input end of said comparator, said control logic receives said output signal of said comparator and sends out said n-bit digital signal and said control signal to said first capacitor array module.

The second capacitor array module further receives a second comparison signal CMP2. Second ends of said plurality of second capacitors coupled to said first comparison switch (switch $c_2$ shown in the FIG. 5E) and said second comparison switch(switch $d_2$ shown in the FIG. 5E). The first comparison switch is connected to said first reference voltage VREFN and the second comparison switch is connected to said second reference voltage VREFP. The first and said second comparison switch are controlled by said control signal. When said second comparison signal CMP2 is a first signal, said first ends of said plurality of second capacitors are coupled in parallel to said input end of said comparator, said control logic receives said output signal of said comparator and sends out said n-bit digital signal and said control signal to said first capacitor array module.

Capacity of said plurality of first capacitors and said plurality of second capacitors is the same. The number of said plurality of first capacitors and the number of said plurality of second capacitors is n. The capacity ratio between said first capacitors is 2's multiple. And the capacity ratio between said second capacitors is 2's multiple.

Please refer to FIG. 5D to 5G and FIG. 7A to FIG. 7D. In another embodiment of the present invention, an operating method of an analog to digital converter (ADC) is provided. The ADC comprises an input signal switch, a first and a second capacitor array modules, an OP amplifier, a comparator, and a control logic. The input signal switch is configured to receive said first and said second input signals and to send out one of said input signals from an output end. The first capacitor array module is configured to couple said output end of said input signal switch and a reference voltage VCM. The first capacitor array module comprises a plurality of first capacitors. The second capacitor array module is configured to couple said output end of said input signal switch and said reference voltage VCM. The second capacitor array module comprises a plurality of second capacitors. The OP amplifier is configured to couple said output end of said input signal switch and said reference voltage VCM. An output end of said OP amplifier is configured to couple to said first and said second capacitor array modules. First ends of said plurality of first capacitors are coupled to said output end of said input signal switch, said reference voltage VCM, or an output end of said comparator. First ends of said plurality of second capacitors are coupled to said output end of said input signal switch, said reference voltage VCM, or an output end of said comparator. The control logic is configured to receive an output signal of said comparator, to send out said n-bit digital signals and a control signal to said first and said second capacitor array module.

Figure 7A:
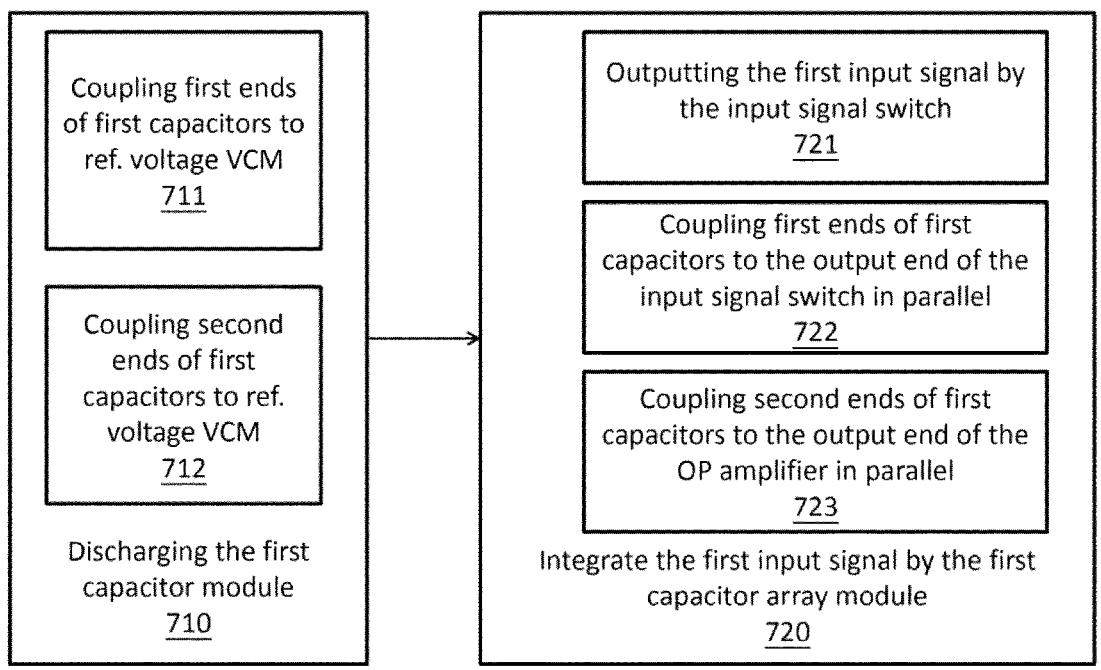
FIG. 7A is a flow chart diagram illustrates an operating method of an analog to digital converter in accordance with an embodiment of the present invention.

Please refer to FIG. 7A, the operating method comprises a step 710, performing steps for discharging said first capacitor array module as follows: at step 711, coupling first ends of said plurality of first capacitors to said reference voltage VCM; and at step 712, coupling second ends of said plurality of first capacitors to said reference voltage VCM.

Please refer to FIG. 7A, the operating method comprises a step 720 performing steps for integration on said first input signal by said first capacitor array module after the step 710, performing said steps for discharging said first capacitor array module as follows: at step 721, outputting said first input signal by said input signal switch; at step 722, coupling said first ends of said plurality of first capacitors in parallel to said output end of said input signal switch; and at step 723, coupling said second ends of said plurality of first capacitors in parallel to said input end of said OP amplifier.

Figure 7B:
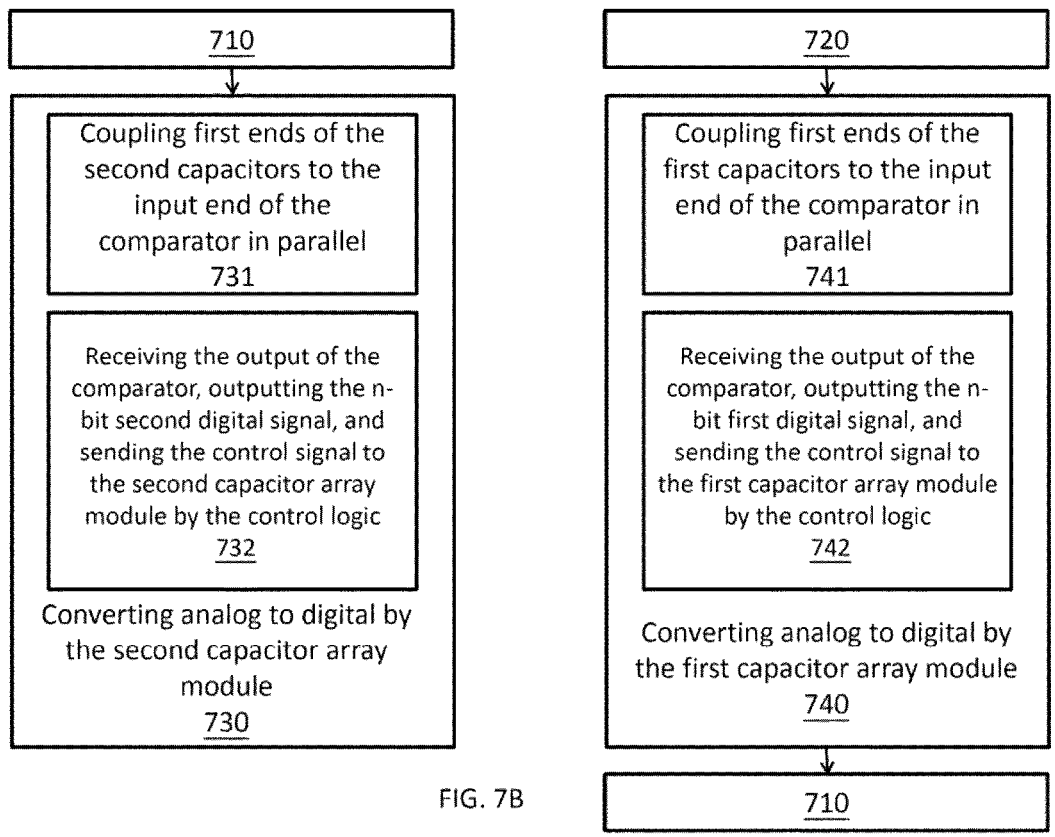
FIG. 7B is a flow chart diagram illustrates an operating method of an analog to digital converter in accordance with another embodiment of the present invention.

Please refer to FIG. 7B, the operating method further comprises a step 730, performing steps for conversion by said second capacitor array module after the step 710, performing said steps for discharging said first capacitor array module as follows: at step 731, coupling first ends of said plurality of second capacitors to said input end of said comparator; and at step 732, receiving said output signal of said comparator by the control logic and sending out said second n-bit digital signal and said control signal to said second capacitor array module.

Second ends of said plurality of second capacitors are coupled to a first comparison switch and a second comparison switch. The first comparison switch is connected to a first reference voltage VREFN and the second comparison switch is connected to a second reference voltage VREFP. The first and said second comparison switches are controlled by said control signal.

Please refer to FIG. 7B, the operating method further comprises a step 740, performing steps for conversion by said first capacitor array module after the step 720, performing said steps for integration by said first capacitor array module as follows: at step 741, coupling said first ends of said plurality of first capacitors to said input end of said comparator; and at step 742, receiving said output signal of said comparator by the control logic and sending out said first n-bit digital signal and said control signal to said first capacitor array module.

Second ends of said plurality of first capacitors are coupled to a first comparison switch and a second comparison switch. The first comparison switch is connected to a first reference voltage VREFN and the second comparison switch is connected to a second reference voltage VREFP. The first and said second comparison switches are controlled by said control signal.

Figure 7C:
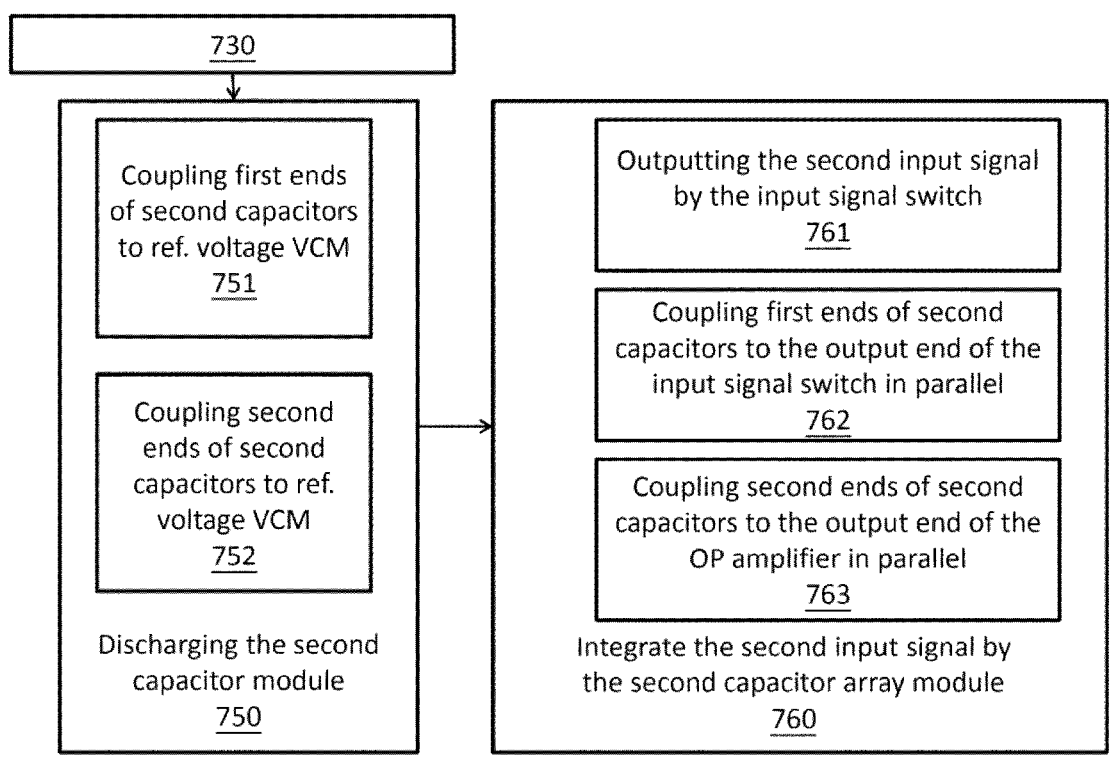
FIG. 7C is a flow chart diagram illustrates an operating method of an analog to digital converter in accordance with another embodiment of the present invention.

Please refer to FIG. 7C, the operating method comprises a step 750, performing steps for discharging said second capacitor array module after the step 730, performing steps for conversion by said second capacitor array module as follows: a step 751, coupling first ends of said plurality of second capacitors to said reference voltage VCM; and a step 752, coupling second ends of said plurality of second capacitors to said reference voltage VCM.

Please refer to FIG. 7C, the operating method further comprises a step 760, performing steps for integration by said second capacitor array module after the step 750, performing steps for discharging said second capacitor array module as follows: at step 761, outputting said second input signal by said input signal switch; at step 762, coupling said first ends of said plurality of second capacitors in parallel to said output end of said input signal switch; and at step 763, coupling said second ends of said plurality of second capacitors in parallel to said input end of said OP amplifier.

Please refer to FIG. 7B, the operating method further comprises the step 710, steps for discharging said first capacitor array module after the step 740, performing steps for conversion by said first capacitor array module as follows: at step 711, coupling first ends of said plurality of first capacitors to said reference voltage VCM; and at step 712, coupling second ends of said plurality of first capacitors to said reference voltage VCM.

Time duration of sending said first n-bit digital signal is as the same as time duration of sending said second n-bit digital signal. Capacity of said plurality of first capacitors and said plurality of second capacitors is the same, the number of said plurality of first capacitors and the number of said plurality of second capacitors is n. The capacity ratio between said first capacitors is 2's multiple, and the capacity ratio between said second capacitors is 2's multiple.

Figure 7D:
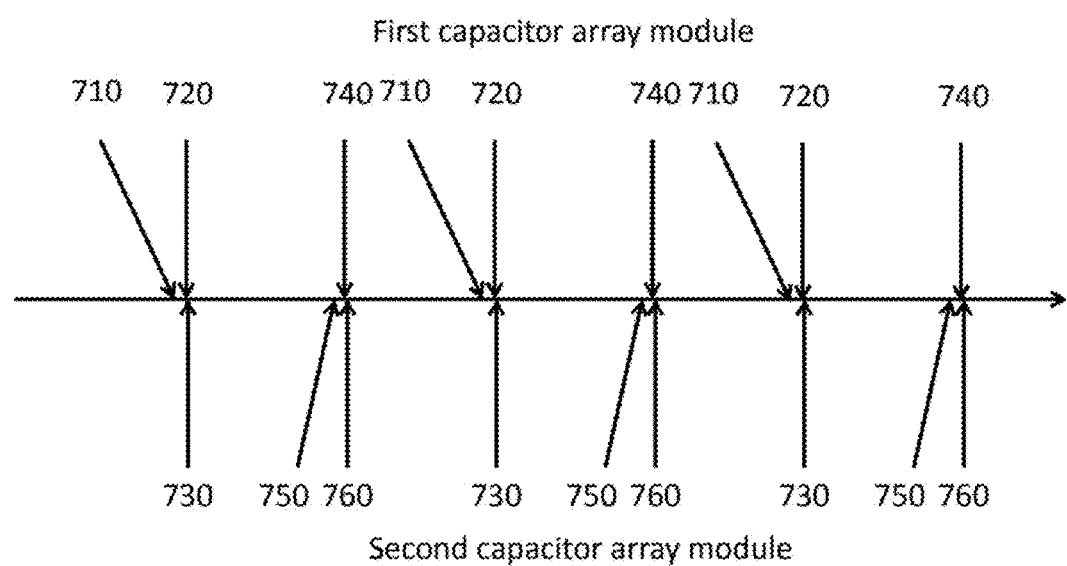
FIG. 7D is a timing sequence diagram depicts an operating method of an analog to digital converter in accordance with another embodiment of the present invention.

Please refer to FIG. 7D, which is a timing sequence diagram of the operating method in accordance with the present invention. The time axis lies from left to right in the middle of the FIG. 7D. The steps represented by arrows above the time axis are manipulated on the first capacitor array module. Similarly, the steps represented by arrows below the time axis are manipulated on the second capacitor array module. In other words, steps 710, 720, and 740 are manipulated on the first capacitor array module; steps 730, 750, and 760 are manipulated on the second capacitor array module.

Ordinary skilled in the art can understand that the order of steps 710, 720, and 740 can be repeated on the first capacitor array module; the order of steps 730, 750, and 760 can be repeated on the second capacitor module. Step 720 for integration is performed on the first capacitor array module while step 730 for conversion is performed on the second capacitor array module. Step 740 for conversion is performed on the first capacitor array module while step 740 for integration is performed on the second capacitor array module. No matter the first or the second capacitor array module, steps 710 or 750 for discharging must be performed after steps 740 or 730 for conversion.

Figure 8A:
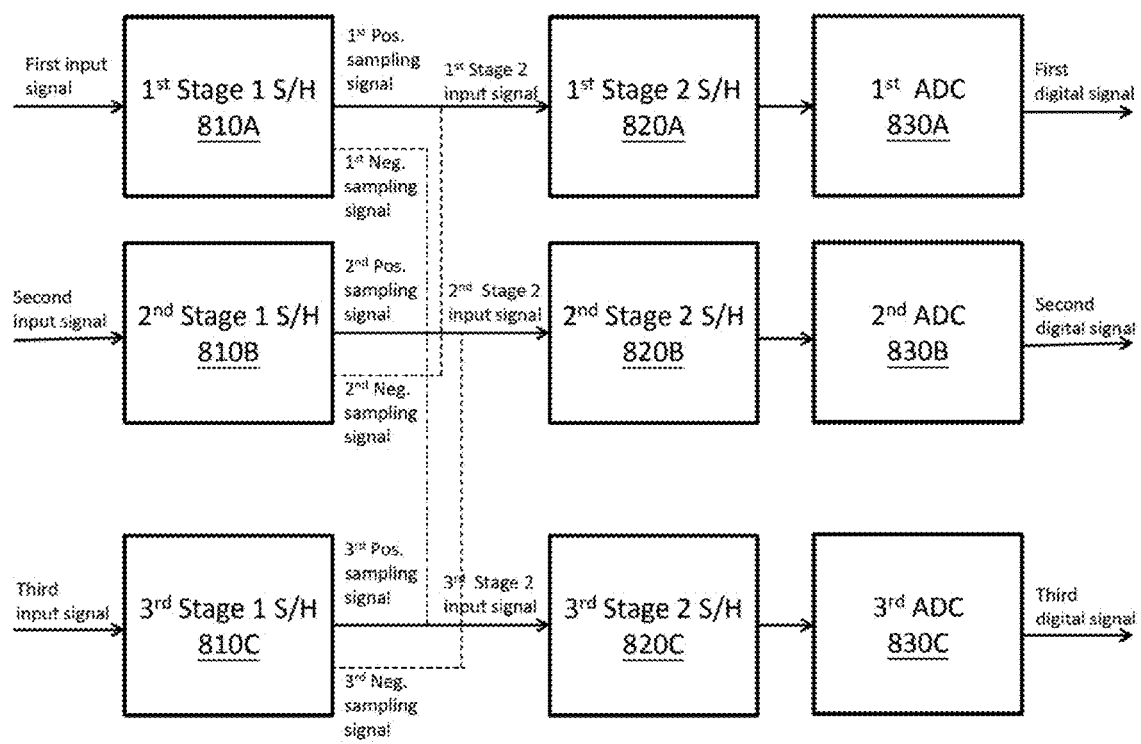
FIG. 8A is a block diagram shows a sensor circuit module in accordance with the present invention.

Please refer to FIG. 8A, which shows an embodiment of the present invention, a circuit for concurrent integration of multiple differential signals is provided. The circuit comprises a plurality of Stage 1 integration (sample and hold) circuit 810A, 810B, and 810C arranged in array. Although three circuit are shown in the FIG. 8A, ordinary skilled in the art can understand that the number of circuit 810 can be more than 3.

Each of Stage 1 integration circuit 810 integrates an input signal, as first, second, and third input signals in the FIG. 8A and outputs concurrently a positive sampling signal and a negative sampling signal. Take the circuit 810A as an example, it is configured to integrate the first input signal and concurrently to output a first positive and a first negative sampling signals, or so-called Stage 1 positive signal and Stage 1 negative signal. Both signals are generated concurrently, there is no any time delay caused by converter.

Each of said Stage 2 integration circuit 820 is configured to integrate a differential signal from a Stage 1 positive signal sent from a corresponding Stage 1 integration circuit 810 and a Stage 1 negative signal sent from another Stage 1 integration circuit 810 next to said corresponding Stage 1 integration circuit 810 to output a Stage 2 signal. Take the first State 2 integration circuit 820A as an example, the first Stage 2 input signal is a differential signal combined from the first positive signal of the first Stage 1 integration circuit 810A and the second negative signal of the second Stage 1 integration circuit 810B which is next to the circuit 810A.

In one embodiment, the differential signal is combined prior to being sent to the Stage 2 integration circuit 820. In another embodiment, the Stage 2 integration circuit 820 receives and combine said Stage 1 positive and negative signals into said differential signal.

As shown in the FIG. 8A, a plurality of analog to digital converters 830 arranged in array are included. Each of analog to digital converter 830 converts a Stage 2 signal from a corresponding Stage 2 integration circuit 820 to a digital signal. At least one of said plurality of analog to digital converters 830 and corresponding Stage 2 integration circuit 820 is a first successive approximation register analog to digital converter (SAR-ADC) as shown in the FIG. 5A to 5C. In other embodiment, the analog to digital converters 830 and corresponding Stage 2 integration circuit 820 is a second successive approximation register analog to digital converter (SAR-ADC)as shown in the FIG. 5D to 5G.

Please refer to FIG. 8A, which shows a sensor circuit module in accordance with an embodiment of the present invention. The module comprises a $1^{st}$ Stage 1 S/H circuit 810A, a $2^{nd}$ Stage 1 S/H circuit 810B, and a $1^{st}$ Stage 2 S/H circuit 820A. The first Stage 1 sample and hold (S/H) circuit 810A is configured to integrate a first input signal and to send out a first positive signal and a first negative signal. Said first positive signal is reverse to said first negative signal. The second Stage 1 S/H circuit 810B is configured to integrate a second input signal and to send out a second positive signal and a second negative signal. Second positive signal is reverse to said second negative signal. The first Stage 2 S/H circuit 820A is configured to receive and combine said first positive signal and said second negative signal into a first Stage 2 input signal to be integrated by said first Stage 2 S/H circuit 820A.

The sensor circuit module further comprises a $3^{rd}$ Stage 1 S/H circuit 810C and a $2^{nd}$ Stage 2 S/H 820B. The third Stage 1 S/H circuit 810C is configured to integrate a third input signal and to send out a third positive signal and third negative signal. Said third positive signal is reverse to said third negative signal. The second Stage 2 S/H circuit 820B is configured to receive and combine said second positive signal and said third negative signal into a second Stage 2 input signal to be integrated by said second Stage 2 S/H circuit 820B.

The sensor circuit module further comprises a third Stage 2 S/H circuit 820C configured to receive and combine said third positive signal and said first negative signal into a third Stage 2 input signal to be integrated by said third Stage 2 S/H circuit 820C.

The sensor circuit module further comprises a first analog to digital converter 830A configured to convert an analog output signal from said first Stage 2 S/H circuit 820A to a first digital signal.

In one embodiment, the first Stage 2 input signal is combined from said first positive (sampling) signal and said second negative (sampling)signal prior to said first Stage 2 S/H circuit 820A receives said first Stage 2 input signal. In another embodiment, the first Stage 2 S/H circuit 820A receives said first positive (sampling)signal and said second negative(sampling) signal prior to combine and integrate to said first Stage 2 input signal.

Figure 8B:
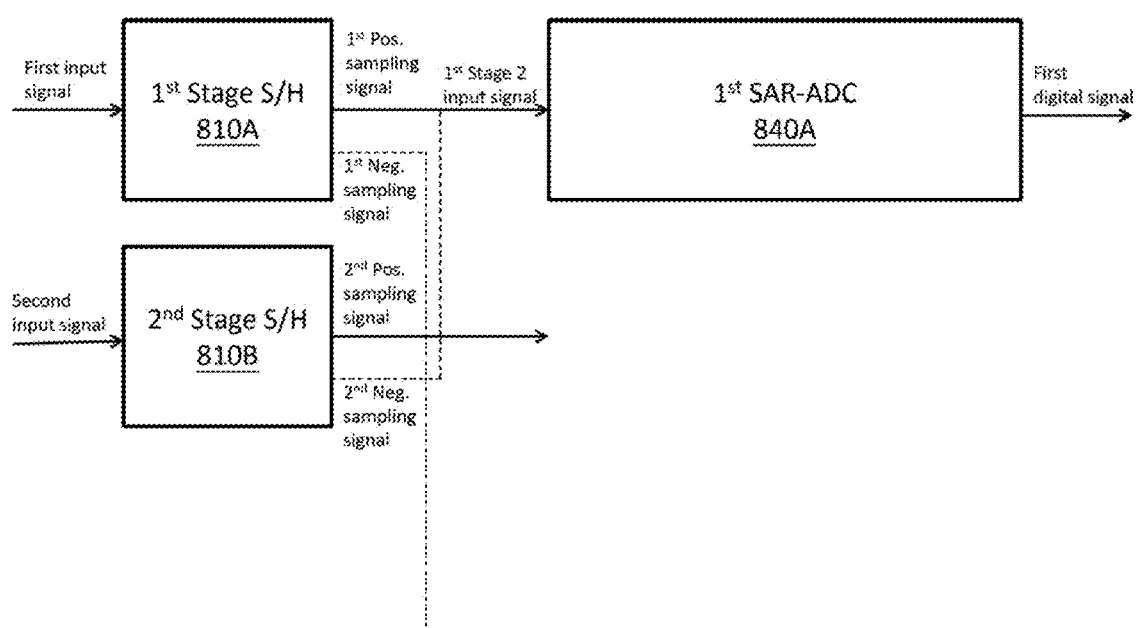
FIG. 8B is a block diagram shows another sensor circuit module in accordance with the present invention.

Please refer to FIG. 8B, which illustrates another embodiment of the present invention. The first Stage 2 S/H circuit 820A and said first analog to digital converter 830A is a first successive approximation register analog to digital converter (SAR-ADC) 840A. The said first positive(sampling) signal and said first negative (sampling) signal are sent concurrently, there is no any time delay caused by inverter in-between.

Please refer to FIG. 5A to 5C, ordinary skilled in the art can understand the implementations of the SAR-ADC 840A.

The SAR-ADC 840A is configured to integrate said first Stage 2 input signal and to convert it to a first n-bit digital signal. The SAR-ADC 840A comprises a capacitor array module, an OP amplifier, a comparator, and a control logic. The capacitor array module is configured to receive an input signal and a reference voltage VCM. The capacitor array module comprises a plurality of capacitors. First ends of said plurality of capacitors are coupled to said input signal, said reference voltage VCM, or an input end of said comparator. An output end of said comparator is coupled to said capacitor array module. The said control logic configured to receive an output end of said comparator and send out an n-bit digital signal and a control signal to said capacitor array module.

Figure 8C:
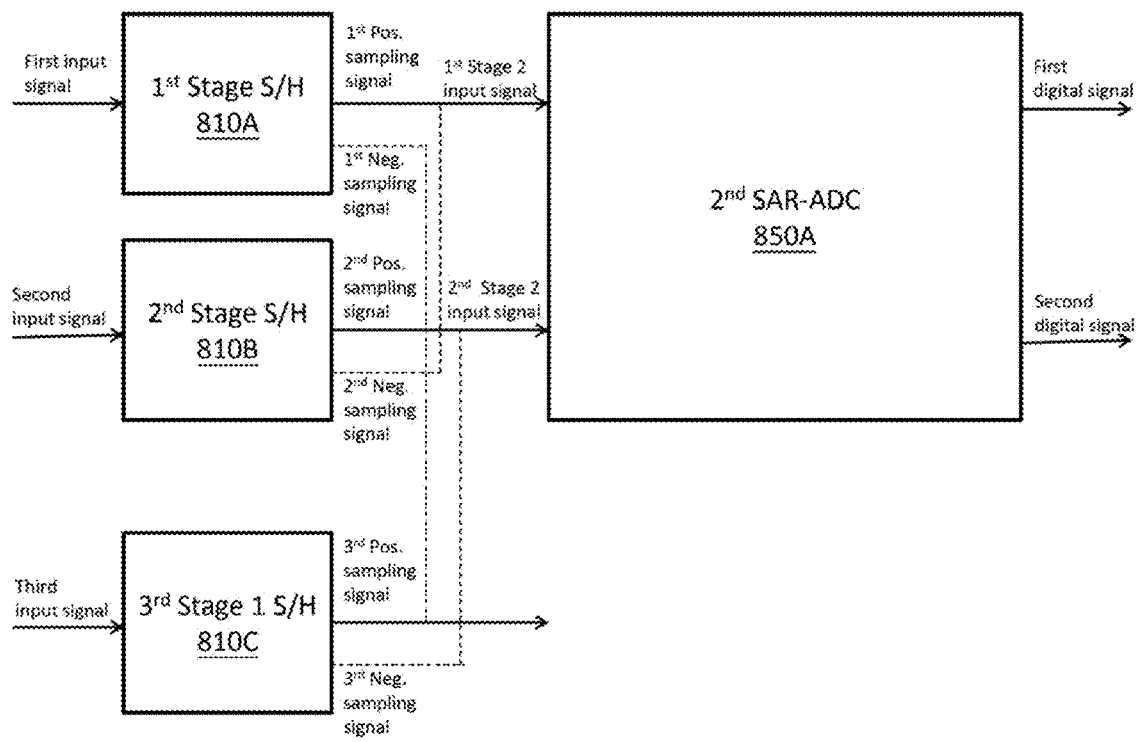
FIG. 8C is a block diagram shows another sensor circuit module in accordance with the present invention.

Please refer to FIG. 8C, which sketches an embodiment of the present invention. The first Stage 2 S/H circuit 820A, the second Stage 2 S/H circuit 820B, and analog to digital conversion circuit which converts outputs of the first and the second Stage 2 S/H circuit 820A and 820B is a second SAR-ADC. Please refer to FIG. 5D and FIG. 5G, ordinary skilled in the art can understand the implementations of second SAR-ADC 850A.

The SAR-ADC 850A comprises an input signal switch, a first and a second capacitor array modules, an OP amplifier, a comparator, and a control logic. The input signal switch is configured to receive said first and said second input signals and to send out one of said input signals from an output end. The first capacitor array module is configured to couple said output end of said input signal switch and a reference voltage VCM. The first capacitor array module comprises a plurality of first capacitors. The second capacitor array module is configured to couple said output end of said input signal switch and said reference voltage VCM. The second capacitor array module comprises a plurality of second capacitors. The OP amplifier is configured to couple said output end of said input signal switch and said reference voltage VCM. An output end of said OP amplifier is configured to couple to said first and said second capacitor array modules. First ends of said plurality of first capacitors are coupled to said output end of said input signal switch, said reference voltage VCM, or an output end of said comparator. First ends of said plurality of second capacitors are coupled to said output end of said input signal switch, said reference voltage VCM, or an output end of said comparator. The control logic is configured to receive an output signal of said comparator, to send out said n-bit digital signals and a control signal to said first and said second capacitor array module.

The first input signal and the second input signal coupled to a first wire and a second wire of a touch sensor module, respectively. The first wire is next to the second wire.

Please refer to FIG. 8A to 8C and 9A, which shows an operating method of a sensor circuit module in accordance with an embodiment of the present invention. At step 902, receiving a first positive signal from a first Stage 1 S/H circuit. The first positive signal is reverse to a first negative signal from the first Stage 1 S/H circuit. At step 904, receiving a second negative signal from a second Stage 1 S/H circuit. The second negative signal is reverse to a second positive signal from the second Stage 1 S/H circuit. At step 906, receiving and combining said first positive signal and said second negative signal to a first Stage 2 input signal. And at step 908, integrating said first Stage 2 input signal.

Figure 9A:
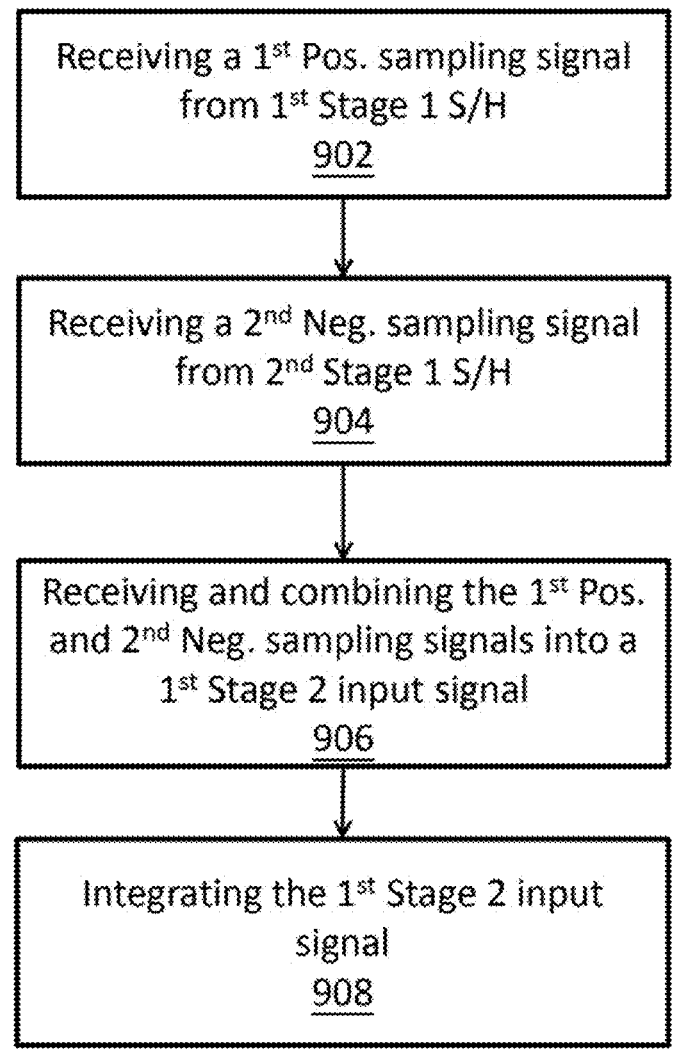
FIG. 9A is a flow chart diagram depicts an operating method of a sensor circuit module in accordance with the present invention.
Figure 9B:
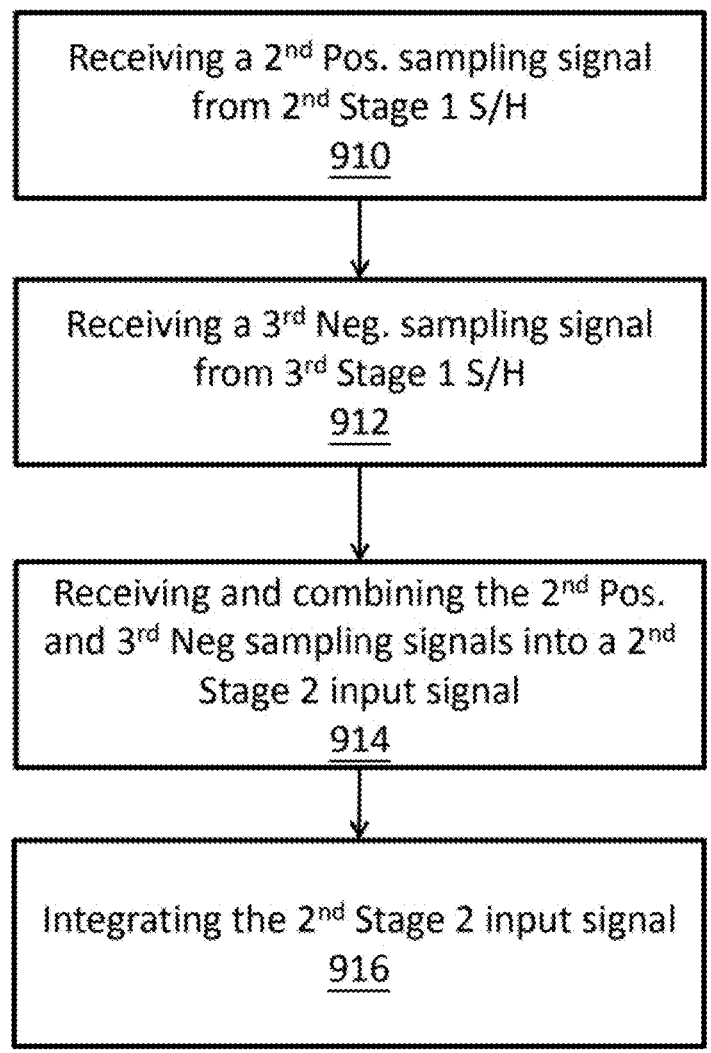
FIG. 9B is a flow chart diagram depicts an operating method of a sensor circuit module in accordance with the present invention.

Please refer to FIG. 9B, the operating method shown in the FIG. 9A could further comprises the followings. At step 910, receiving said second positive signal from said second Stage 1 S/H circuit. At step 912, receiving a third negative signal from a third Stage 1 S/H circuit. The third negative signal is reverse to a third positive signal from said third Stage 1 S/H circuit. At step 914, receiving and combining said second positive signal and said third negative signal to a second Stage 2 input signal. At step 916, integrating said second Stage 2 input signal.

Figure 9C:
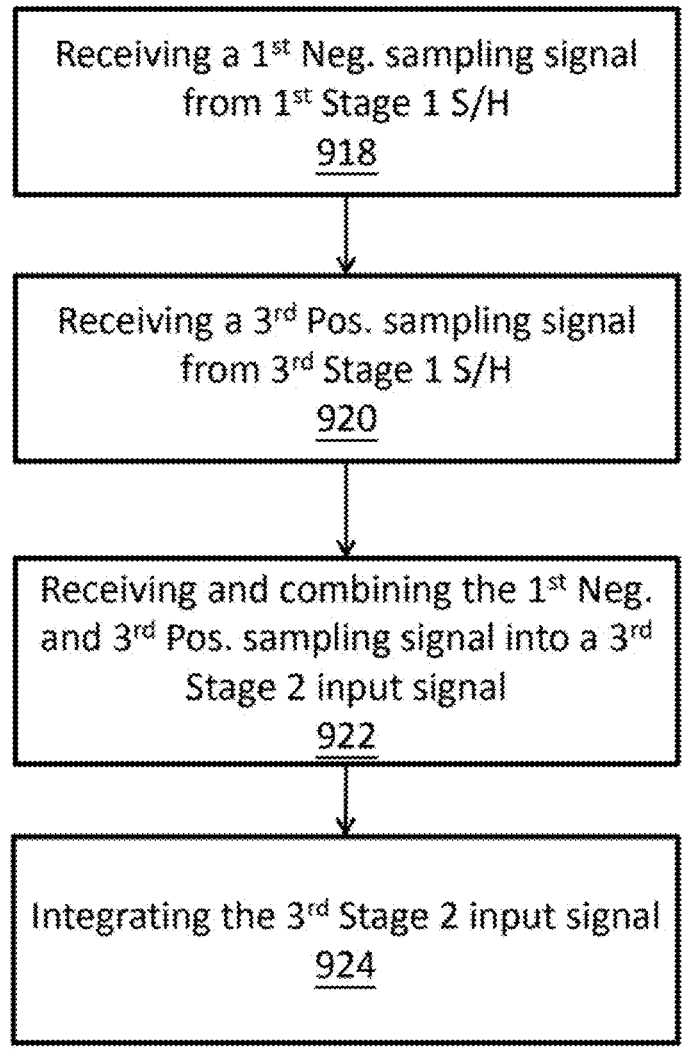
FIG. 9C is a flow chart diagram depicts an operating method of a sensor circuit module in accordance with the present invention.

Please refer to FIG. 9C, the operating method shown in the FIGS. 9A and 9B could further comprises the followings. At step 918, receiving said first negative signal from said first Stage 1 S/H circuit. At step 920, receiving said third positive signal from said third Stage 1 S/H circuit. At step 922, receiving and combing said first negative signal and said third positive signal to a third Stage 2 input signal. And at step 924, integrating said third Stage 2 input signal.

Ordinary skilled in the art can understand the steps shown in the FIGS. 9A, 9B, and 9B can be performed independently and/or concurrently.

The operating method further comprises conversion on the integrated Stage 2 input signal to a digital signal by a first SAR-ADC. The SAR-ADC is configured to integrate said Stage 2 input signal and to convert it to a first n-bit digital signal. The SAR-ADC comprises a capacitor array module, an OP amplifier, a comparator, and a control logic. The capacitor array module is configured to receive an input signal and a reference voltage VCM. The capacitor array module comprises a plurality of capacitors. First ends of said plurality of capacitors are coupled to said input signal, said reference voltage VCM, or an input end of said comparator. An output end of said comparator is coupled to said capacitor array module. The said control logic configured to receive an output end of said comparator and send out an n-bit digital signal and a control signal to said capacitor array module.

The operating method may further comprises: converting said first Stage 2 input signal to a first digital signal; and converting said second Stage 2 input signal to a second digital signal. Both the converting steps are performed by a second SAR-ADC.

The SAR-ADC comprises an input signal switch, a first and a second capacitor array modules, an OP amplifier, a comparator, and a control logic. The input signal switch is configured to receive said first and said second input signals and to send out one of said input signals from an output end. The first capacitor array module is configured to couple said output end of said input signal switch and a reference voltage VCM. The first capacitor array module comprises a plurality of first capacitors. The second capacitor array module is configured to couple said output end of said input signal switch and said reference voltage VCM. The second capacitor array module comprises a plurality of second capacitors. The OP amplifier is configured to couple said output end of said input signal switch and said reference voltage VCM. An output end of said OP amplifier is configured to couple to said first and said second capacitor array modules. First ends of said plurality of first capacitors are coupled to said output end of said input signal switch, said reference voltage VCM, or an output end of said comparator. First ends of said plurality of second capacitors are coupled to said output end of said input signal switch, said reference voltage VCM, or an output end of said comparator. The control logic is configured to receive an output signal of said comparator, to send out said n-bit digital signals and a control signal to said first and said second capacitor array module.

The first input signal and the second input signal coupled to a first wire and a second wire of a touch sensor module, respectively. The first wire is next to the second wire.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

The invention claimed is:

1. An integration and analog to digital conversion circuit sharing common capacitors, comprises:
    a first capacitor array module having a plurality of capacitors;
    a second capacitor array module having a plurality of capacitors;
    a integration circuit configured to integrate an analog signal by said first or said second capacitor array module; and
    an analog to digital conversion (ADC) logic configured to convert the output of said first or said second capacitor array module to a digital signal,
    wherein said ADC logic performing conversion by said first capacitor array module while said integration circuit performing integration by said second capacitor array module, and said ADC logic performing conversion by said second capacitor array module while said integration circuit performing integration by said first capacitor array module.

2. The circuit of claim 1, wherein at least part or all of said plurality of capacitors are used for integration, wherein the two ends of those capacitors used for integration are coupled to an input end and an output end of said integration circuit in parallel, respectively, and wherein said integration circuit configured to integrate said analog signal according to a reference signal.

3. The circuit of claim 2, wherein said integration circuit comprises an OP amplifier which has a first input end, a second input end, and an output end, wherein said first input end is coupled to said analog signal, wherein said second input end is coupled to said reference signal, and wherein said first input end and said output end are coupled to the two ends of said capacitors configured for integration in parallel, respectively.

4. The circuit of claim 1, wherein said ADC logic further comprises a comparator, wherein said ADC logic, in turn, control each of said plurality of capacitors configured for integration to output to said comparator for converting said outputs of said plurality of capacitors to said digital signal.

5. The circuit of claim 1, wherein said integration circuit, in turn, takes control of said first or said second capacitor array module while said ADC logic takes control of the other.

6. The circuit of claim 1, wherein said analog signal is selected from a plurality of analog inputs and said digital signal is sent to a plurality of digital outputs, wherein said plurality analog inputs are corresponding to said plurality of digital outputs.

7. The circuit of claim 1, wherein capacity of said first and said second capacitor array modules are the same and both said first and said second capacitor array modules comprise equivalent capacitors.

8. An analog to digital converter, configured to integrate a first input signal and a second input signal, respectively, and to convert in turn to a first n-bit digital signal and a second n-bit digital signal, said analog to digital converter comprises:
    an input signal switch, configured to receive said first and said second input signals and to send out one of said input signals from an output end;
    a first capacitor array module, configured to couple said output end of said input signal switch and a reference voltage VCM, wherein said first capacitor array module comprises a plurality of first capacitors;

a second capacitor array module, configured to couple said output end of said input signal switch and said reference voltage VCM, wherein said second capacitor array module comprises a plurality of second capacitors;

an OP amplifier, configured to couple said output end of said input signal switch and said reference voltage VCM, an output end of said OP amplifier is configured to couple to said first and said second capacitor array modules;

a comparator, wherein first ends of said plurality of first capacitors are coupled to said output end of said input signal switch, said reference voltage VCM, or an output end of said comparator, wherein first ends of said plurality of second capacitors are coupled to said output end of said input signal switch, said reference voltage VCM, or an output end of said comparator; and a control logic, configured to receive an output signal of said comparator, to send out said n-bit digital signals and a control signal to said first and said second capacitor array module.

9. The analog to digital converter of claim 8, wherein said first capacitor array module further receives a first reset signal RST1, second ends of said plurality of first capacitors coupled to a first reset switch in parallel which is connected to said reference voltage VCM, wherein when said first reset signal RST1 is a first signal, said first ends of said plurality of first capacitors are coupled to said reference voltage VCM and said first reset switch is closed, whereas said first ends and said second ends of said plurality of first capacitors are connected to said reference voltage, and wherein said second capacitor array module further receives a second reset signal RST2, second ends of said plurality of second capacitors coupled to a second reset switch in parallel which is connected to said reference voltage VCM, wherein when said second reset signal RST2 is a first signal, said first ends of said plurality of second capacitors are coupled to said reference voltage VCM and said first reset switch is closed, whereas said first ends and said second ends of said plurality of second capacitors are connected to said reference voltage.

10. The analog to digital converter of claim 8, wherein said first capacitor array module further receives a first integration signal INT1, second ends of said plurality of first capacitors coupled to a first integration switch in parallel which is connected to said output end of said OP amplifier, wherein when said first integration signal INT1 is a first signal, said first ends of said plurality of first capacitors are coupled in parallel to said output end of said input signal switch and said first integration switch is closed, whereas said output signal of said input signal switch is integrated by said plurality of first capacitors, and wherein said second capacitor array module further receives a second integration signal INT2, second ends of said plurality of second capacitors coupled to a second integration switch in parallel which is connected to said output end of said OP amplifier, wherein when said second integration signal INT1 is a first signal, said first ends of said plurality of second capacitors are coupled in parallel to said output end of said input signal switch and said second integration switch is closed, whereas said output signal of said input signal switch is integrated by said plurality of second capacitors.

11. The analog to digital converter of claim 8, wherein said first capacitor array module further receives a first comparison signal CMP1, second ends of said plurality of first capacitors coupled to a first comparison switch and a second comparison switch, said first comparison switch is connected to a first reference voltage VREFN and said second comparison switch is connected to a second reference voltage VREFP, said first and said second comparison switch are controlled by said control signal, wherein when said first comparison signal CMP1 is a first signal, said first ends of said plurality of first capacitors are coupled in parallel to said input end of said comparator, said control logic receives said output signal of said comparator and sends out said n-bit digital signal and said control signal to said first capacitor array module, and wherein said second capacitor array module further receives a second comparison signal CMP2, second ends of said plurality of second capacitors coupled to said first comparison switch and said second comparison switch, said first comparison switch is connected to said first reference voltage VREFN and said second comparison switch is connected to said second reference voltage VREFP, said first and said second comparison switch are controlled by said control signal, wherein when said second comparison signal CMP2 is a first signal, said first ends of said plurality of second capacitors are coupled in parallel to said input end of said comparator, said control logic receives said output signal of said comparator and sends out said n-bit digital signal and said control signal to said first capacitor array module.

12. The analog to digital converter of claim 8, wherein capacity of said plurality of first capacitors and said plurality of second capacitors is the same, the number of said plurality of first capacitors and the number of said plurality of second capacitors is n, the capacity ratio between said first capacitors is 2's multiple, and the capacity ratio between said second capacitors is 2's multiple.

13. An operating method of an analog to digital converter, wherein said analog to digital converter comprises an input signal switch, a first capacitor array module, a second capacitor array module, an OP amplifier, a comparator, and a control logic, wherein said input signal switch configured to receive a first and a second input signals and to send out one of said input signals from an output end, wherein said first capacitor array module configured to couple said output end of said input signal switch and a reference voltage VCM, wherein said first capacitor array module comprises a plurality of first capacitors, wherein second capacitor array module, configured to couple said output end of said input signal switch and said reference voltage VCM, wherein said second capacitor array module comprises a plurality of second capacitors, wherein first ends of said plurality of first capacitors are coupled to said output end of said input signal switch, said reference voltage VCM, or an output end of said comparator, wherein first ends of said plurality of second capacitors are coupled to said output end of said input signal switch, said reference voltage VCM, or an output end of said comparator, said OP amplifier configured to couple said output end of said input signal switch and said reference voltage VCM, an output end of said OP amplifier is configured to couple to said first and said second capacitor array modules, said control logic configured to receive an output signal of said comparator, to send out a first and a second n-bit digital signals and a control signal to said first and said second capacitor array module, said operating method comprises performing steps for discharging said first capacitor array module as follows:

coupling first ends of said plurality of first capacitors to said reference voltage VCM; and coupling second ends of said plurality of first capacitors to said reference voltage VCM.

14. The operating method of claim 13, further comprises performing steps for integration on said first input signal by said first capacitor array module after performing said steps for discharging said first capacitor array module as follows:

> outputting said first input signal by said input signal switch;
> coupling said first ends of said plurality of first capacitors in parallel to said output end of said input signal switch; and
> coupling said second ends of said plurality of first capacitors in parallel to said input end of said OP amplifier.

15. The operating method of claim 13, further comprises performing steps for conversion by said second capacitor array module after performing said steps for discharging said first capacitor array module as follows:

> coupling first ends of said plurality of second capacitors to said input end of said comparator; and
> receiving said output signal of said comparator by the control logic and sending out said second n-bit digital signal and said control signal to said second capacitor array module.

16. The operating method of claim 15, wherein said second ends of said plurality of second capacitors are coupled to a first comparison switch and a second comparison switch, said first comparison switch is connected to a first reference voltage VREFN and said second comparison switch is connected to a second reference voltage VREFP, said first and said second comparison switches are controlled by said control signal.

17. The operating method of claim 15, further comprises performing steps for conversion by said first capacitor array module after performing said steps for integration by said first capacitor array module as follows:

> coupling said first ends of said plurality of first capacitors to said input end of said comparator; and
> receiving said output signal of said comparator by the control logic and sending out said first n-bit digital signal and said control signal to said first capacitor array module.

18. The operating method of claim 17, wherein said second ends of said plurality of first capacitors are coupled to a first comparison switch and a second comparison switch, said first comparison switch is connected to a first reference voltage VREFN and said second comparison switch is connected to a second reference voltage VREFP, said first and said second comparison switches are controlled by said control signal.

19. The operating method of claim 15, further comprises performing steps for discharging said second capacitor array module after performing steps for conversion by said second capacitor array module as follows:

> coupling first ends of said plurality of second capacitors to said reference voltage VCM; and
> coupling second ends of said plurality of second capacitors to said reference voltage VCM.

20. The operating method of claim 19, further comprises performing steps for integration by said second capacitor array module after performing steps for discharging said second capacitor array module as follows:

> outputting said second input signal by said input signal switch;
> coupling said first ends of said plurality of second capacitors in parallel to said output end of said input signal switch; and
> coupling said second ends of said plurality of second capacitors in parallel to said input end of said OP amplifier.

21. The operating method of claim 17, further comprises steps for discharging said first capacitor array module after performing steps for conversion by said first capacitor array module as follows:

> coupling first ends of said plurality of first capacitors to said reference voltage VCM; and
> coupling second ends of said plurality of first capacitors to said reference voltage VCM.

22. The operating method of claim 13, wherein time duration of sending said first n-bit digital signal is as the same as time duration of sending said second n-bit digital signal.

23. The operating method of claim 13, wherein capacity of said plurality of first capacitors and said plurality of second capacitors is the same, the number of said plurality of first capacitors and the number of said plurality of second capacitors is n, the capacity ratio between said first capacitors is 2's multiple, and the capacity ratio between said second capacitors is 2's multiple.

* * * * *